(12) United States Patent
Takeuchi et al.

(10) Patent No.: US 7,612,811 B2
(45) Date of Patent: Nov. 3, 2009

(54) SOLID STATE IMAGING DEVICE INCORPORATING A LIGHT SHIELDING FILM HAVING OPENINGS OF DIFFERENT SIZES

(75) Inventors: Yutaka Takeuchi, Miyagi (JP); Katsuhiro Shibata, Miyagi (JP); Shinji Uya, Miyagi (JP); Makoto Shizukuishi, Miyagi (JP)

(73) Assignee: Fujifilm Holdings Corp., Kanagawa (JP)

( * ) Notice: Subject to any disclaimer, the term of this patent is extended or adjusted under 35 U.S.C. 154(b) by 672 days.

(21) Appl. No.: 10/936,590

(22) Filed: Sep. 9, 2004

(65) Prior Publication Data
US 2005/0062863 A1 Mar. 24, 2005

(30) Foreign Application Priority Data
Sep. 19, 2003 (JP) ............................. 2003-327664
May 13, 2004 (JP) ............................. 2004-143626

(51) Int. Cl.
*H04N 5/335* (2006.01)
(52) U.S. Cl. .................................................... 348/272
(58) Field of Classification Search ................ 348/272, 348/340, 273, 311, 315, 222.1
See application file for complete search history.

(56) References Cited

U.S. PATENT DOCUMENTS

| | | | | |
|---|---|---|---|---|
| 4,829,368 A | * | 5/1989 | Kobayashi et al. | 348/222.1 |
| 5,215,928 A | * | 6/1993 | Hirai | 438/59 |
| 5,804,827 A | * | 9/1998 | Akagawa et al. | 250/370.06 |
| 6,057,586 A | * | 5/2000 | Bawolek et al. | 257/435 |
| 6,366,025 B1 | * | 4/2002 | Yamada | 315/169.3 |
| 6,429,038 B2 | * | 8/2002 | Sekine | 438/70 |
| 6,606,124 B1 | * | 8/2003 | Hatano et al. | 348/311 |
| 6,674,470 B1 | * | 1/2004 | Tanaka et al. | 348/302 |
| 7,084,905 B1 | * | 8/2006 | Nayar et al. | 348/222.1 |
| 7,110,031 B2 | * | 9/2006 | Kondo et al. | 348/315 |
| 7,259,791 B2 | * | 8/2007 | Fukusho et al. | 348/340 |
| 2001/0026322 A1 | * | 10/2001 | Takahashi et al. | 348/340 |

(Continued)

FOREIGN PATENT DOCUMENTS

JP 59-069964 A 4/1984

(Continued)

OTHER PUBLICATIONS

Japanese Office Action dated Feb. 27, 2009, 4 pages.

*Primary Examiner*—Tuan V Ho
*Assistant Examiner*—Kent Wang
(74) *Attorney, Agent, or Firm*—Arent Fox LLP.

(57) ABSTRACT

A solid state imaging device comprises a color decomposer that decomposes incident light into at least a color of a first wavelength and a color of a second wavelength that is shorter than the first wavelength, a light shielding film that is formed under the color decomposer and comprises first openings through which light decomposed to the color of the first wavelength is transmitted and second openings through which light decomposed to the color of the second wavelength is transmitted, the second openings being formed to be larger than the first openings, and a plurality of photo electric conversion elements that are arranged in lines and columns, each of the photo electric conversion elements generating signal electric charges corresponding to an amount of the incident light by receiving the incident light decomposed by the color decomposer and passed through the openings of the light shielding film.

26 Claims, 15 Drawing Sheets

U.S. PATENT DOCUMENTS

| | | |
|---|---|---|
| 2002/0063199 A1* | 5/2002 | Kozuka .................... 250/214.1 |
| 2002/0193036 A1* | 12/2002 | Benning et al. ................ 445/24 |
| 2003/0030055 A1* | 2/2003 | Nakano et al. ................. 257/72 |
| 2003/0063204 A1* | 4/2003 | Suda ......................... 348/272 |
| 2003/0103150 A1* | 6/2003 | Catrysse et al. ............. 348/272 |
| 2003/0179457 A1* | 9/2003 | Dobashi et al. ............. 359/619 |
| 2003/0209651 A1* | 11/2003 | Iwasaki ................... 250/214.1 |
| 2005/0133879 A1 | 6/2005 | Yamaguti et al. |

FOREIGN PATENT DOCUMENTS

| | | |
|---|---|---|
| JP | 05-346556 | 12/1993 |
| JP | 07-050401 A | 2/1995 |
| JP | 09-116127 A | 5/1997 |
| JP | 2000-125209 | 4/2000 |
| JP | 2002-198508 | 7/2002 |
| JP | 2003-197897 | 7/2003 |
| JP | 2003-218343 | 7/2003 |
| JP | 2004-193762 | 7/2004 |
| JP | 2005-019958 | 1/2005 |
| WO | 99/17337 A | 4/1999 |

* cited by examiner

| OPENING ENLARGEMENT $\Delta l_R$ AND OPENING REDUCTION $\Delta l_B$ OF LOW-SENSITIVE PHOTODIODE ($\mu m$) | r-SENSITIVITY (%) | g-SENSITIVITY (%) | b-SENSITIVITY (%) |
|---|---|---|---|
| 0.00 | 100 | 100 | 100 |
| 0.07 | 119 | 103 | 86 |
| 0.14 | 149 | 105 | 80 |

| OPENING ENLARGEMENT $\Delta l_R$ AND OPENING REDUCTION $\Delta l_B$ OF HIGH-SENSITIVE PHOTODIODE ($\mu m$) | R-SENSITIVITY (%) | G-SENSITIVITY (%) | B-SENSITIVITY (%) |
|---|---|---|---|
| 0.00 | 100 | 100 | 100 |
| 0.07 | 102 | 103 | 99 |
| 0.14 | 105 | 103 | 107 |

| OPENING ENLARGEMENT Δl$_R$ AND OPENING REDUCTION Δl$_B$ OF HIGH-SENSITIVE PHOTODIODE (μm) | R/r SENSITIVITY RATIO (%) | G/g SENSITIVITY RATIO (%) | B/b SENSITIVITY RATIO (%) |
|---|---|---|---|
| 0.00 | 104 | 100 | 79 |
| 0.07 | 89 | 100 | 91 |
| 0.14 | 74 | 96 | 105 |

SOLID STATE IMAGING DEVICE INCORPORATING A LIGHT SHIELDING FILM HAVING OPENINGS OF DIFFERENT SIZES

CROSS REFERENCE TO RELATED APPLICATION

This application is based on Japanese Patent Application 2003-327664, filed on Sep. 19, 2003, and Japanese Patent Application 2004-143626, field on May 13, 2004, the entire contents of which are incorporated herein by reference.

BACKGROUND OF THE INVENTION

A) Field of the Invention

This invention relates to a solid state imaging device having a plurality of photoelectric conversion elements (photodiodes) in a light receiving region.

B) Description of the Related Art

As a solid state imaging device, a CCD solid state imaging device that transmits a signal charge using a charge coupled device (CCD), a MOS type solid state imaging device that outputs after amplifying an image signal from a photosensitive element with a MOS transistor and the like are well known. The photosensitive elements may be arranged in a tetragonal matrix wherein the elements are arranged in a fixed pitch in row and column directions or a honeycomb arrangement (Pixel Interleaved Arrangement) wherein the elements in the even number rows/columns and in the odd number rows/columns are shifted in a horizontal/vertical direction, for example, by about a half pitch of the elements.

In a case of a solid state imaging device equipped with an on-chip color filter, a color filter layer is formed on a semiconductor chip on which photosensitive elements and signal transmission parts are formed. In many cases, on-chip micro lenses are arranged over the color filter layer so that an incident light can be efficiently led into the photosensitive element.

A solid state imaging device equipped with more than two types of photodiodes receiving light of different sensitivity in one pixel is proposed (for example, refer to Japanese Patent Application 2002-016835 (Patent Document 1), Japanese Patent Application 2002-356813 (Patent Document 2), Japanese Patent Application Hei10-289052 (Patent Document 3)). High-sensitive photodiodes are formed in a relatively large region of the semiconductor chip, and low-sensitive photodiodes are formed in a relatively small region. When the high-sensitive photodiodes and the low-sensitive photodiodes which have different sensitivity are formed in the light receiving region of the solid state imaging device, an image having a wide dynamic range can be obtained.

In order to obtain an image having a wide dynamic range, output signals of the high-sensitive photodiode and the low-sensitive photodiode are synthesized. At that time, by adjusting spectral sensitivity of each type of the photodiode, it is preferable to avoid deterioration of a color S/N ratio after white balance correction.

In the patent document 1, a solid state imaging device having a structure wherein a fixed color filter is positioned over each photodiode is disclosed. Two types of photodiodes, each of which is formed with an n-type impurity layer in a p-type well, that is, the high-sensitive photodiode and the low-sensitive photodiode, have different impurity distributions, sizes and shapes, for example, an n-type impurity layer of the low-sensitive photodiode has a narrow doped region. Therefore, a narrow channel effect by a p-type isolation layer formed between a p-type well, the high-sensitive photodiode and the low-sensitive photodiode causes a shallow depletion layer of the low-sensitive photodiode, and sensitivity in a long wave side tends to decrease. Therefore, spectrum sensitivity between the high-sensitive photodiode and the low-sensitive photodiode tends to become imbalanced. In a solid state imaging device having a structure having a fixed colored color filter layer on an upper part of each photodiode, it is difficult that the low-sensitive photodiode and the high-sensitive photodiode have a same spectrum sensitivity. Although it is possible to adjust spectrum sensitivity by changing conditions such as an amount of dose and acceleration energy at a time of ion-implantation of impurities, other properties receive a bad influence.

In the solid-state imaging device, the incidence ray energy per unit area declines as it goes toward a peripheral area of a light receiving region. As a result, an amount of light will decrease at the peripheral area of the light receiving region, and that phenomenon is called illumination shading. Various methods for improving this illumination shading have been suggested. For example, in Japanese Laid-Open Patent Hei5-346556 (Patent Document 4), a method for controlling a decrease of light concentrating efficiency at a peripheral area of the solid-state imaging device by a so-called "micro-lens shifting" is disclosed. Also, in Japanese Laid-Open Patent 2002-198508 (Patent Document 5), a method for preventing shading of the incident light at a peripheral area of the light receiving region by shifting an opening position of a light shielding film toward the center of the solid-state imaging device is disclosed. Moreover, in Japanese Laid-Open Patent 2003-197897 (Patent Document 6), a method that the incident light certainly passes the opening by filling up a material with a high refractive index in the light shielding film opening is disclosed.

In recent years, by further increase of a number of pixels and miniaturization of a pixel size in a solid-state imaging device, in addition to the above-described illumination shading, color shading has become one of problems.

SUMMARY OF THE INVENTION

It is an object of the present invention to provide a solid-state imaging device to prevent a decline of sensitivity.

It is another object of the present invention to provide a solid-state imaging device that can prevent a decline of sensitivity and color shading at a peripheral area of a light receiving region.

It is a further object of the present invention to provide a solid state imaging device, which has plural types of photodiodes that have different sensitivity properties, wherein spectrum sensitivity is adjusted to a fixed value.

It is still another object of the present invention to provide a solid state imaging device equipped with plural types of photodiodes, which have different sensitivity properties and have high spectrum sensitivity.

According to one aspect of the present invention, there is provided a solid state imaging device, comprising: a color decomposer that decomposes incident light into a plurality of colors including at least a color of a first wavelength and a color of a second wavelength that is shorter than the first wavelength; a light shielding film that is formed under the color decomposer and comprises first openings through which light decomposed to the color of the first wavelength is transmitted and second openings through which light decomposed to the color of the second wavelength is transmitted, the second openings being formed to be larger than the first openings; and a plurality of photo electric conversion elements that are arranged in lines and columns, each of the photo electric conversion elements generating signal electric charges corresponding to an amount of the incident light by receiving the incident light decomposed by the color decomposer and passed through the openings of the light shielding film.

According to another aspect of the present invention, there is provided a solid state imaging device, comprising: a color decomposer that decomposes incident light into a color of a first wavelength, a color of a second wavelength that is shorter than the first wavelength, and a color of a third wavelength; a light shielding film that is formed under the color decomposer and comprises first openings through which light decomposed to the color of the first wavelength is transmitted, second openings through which light decomposed to the color of the second wavelength is transmitted, and third openings through which light decomposed to the color of the third wavelength is transmitted; and a plurality of photo electric conversion elements that are arranged in lines and columns, each of the photo electric conversion elements generating signal electric charges corresponding to an amount of the incident light by receiving the incident light decomposed by the color decomposer and passed through the openings of the light shielding film and comprising a first photo electric conversion element with a first sensitivity and a second photo electric conversion element with a second sensitivity that is lower than the first sensitivity, wherein a size of a region of each first opening over the second photoelectric conversion element is larger than a size of a region of each second opening over the second photoelectric conversion element or a size of a region of each third opening over the second photoelectric conversion element is smaller than the size of the region of each second opening over the second photoelectric conversion element.

By controlling the sizes of the regions of the first to third openings over the second photoelectric conversion element, spectral sensitivity of the solid state imaging device can be set at a desired value. Therefore, the spectral sensitivity can be set at a higher value.

According to the present invention, a solid-state imaging device to prevent a decline of sensitivity may be provided.

Also, according to the present invention, a solid-state imaging device that can prevent a decline of sensitivity and color shading at a peripheral area of the light receiving region may be provided.

Further, according to the present invention, a solid state imaging device which has plural types of photodiodes that have different sensitivity properties and wherein spectrum sensitivity is adjusted to a fixed value can be provided.

Moreover, according to the present invention, a solid state imaging device equipped with plural types of photodiodes which have different sensitivity properties and having high spectrum sensitivity can be provided.

DETAILED DESCRIPTION OF THE PREFERRED EMBODIMENTS

FIG. 1A, FIG. 1B, FIG. 1C, FIG. 2A, FIG. 2B and FIG. 2C are diagrams for explaining a solid state imaging device according to a first embodiment of the present invention.

Figure 1A:
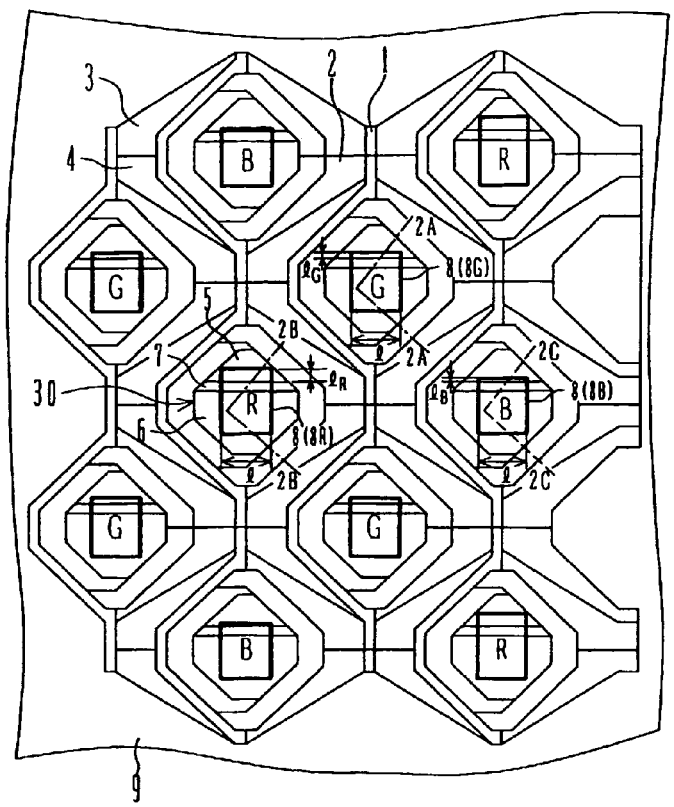
FIG. 1A is a schematic plan view showing a part of a light receiving region of a solid state imaging device according to an embodiment of the present invention.

FIG. 1A is a schematic plan view showing a part of a light receiving region of the solid state imaging device formed on a silicon substrate. Further, in FIG. 1A, in order to avoid complication, some composition elements such as a color filter, a microlens and the like are omitted.

In FIG. 1A, a plurality of photosensitive regions 30 is shown. Each photosensitive region 30 has electric charge accumulation regions having different area sizes and opening ratios, and are formed including two photodiodes having different sensitivity, which are a high-sensitive photodiode 6 and a low-sensitive photodiode 5, and a photodiode isolation region 7 provided between the above-described two photodiodes. The high-sensitive photodiode 6 has a relatively large area and consists of a main photosensitive part. The low-sensitive photodiode 5 has a relatively small area and consists of a sub photosensitive part. As described later, an opening ratio of a light shielding film over the high-sensitive photodiode is larger than that of the low-sensitive photodiode. The high-sensitive photodiode 6 and the low-sensitive photodiode 5 accumulate signal charges corresponding to an amount of incident light. The photodiode isolation region 7 electrically isolates two photodiodes (the high-sensitive photodiode 6 and the low-sensitive photodiode 5) in a pixel.

A vertical CCD channel 2 is positioned on the right of each column of the photosensitive regions or pixels 30. A vertical transfer electrode (a high-sensitive photodiode read-out gate electrode) 4 and a vertical transfer electrode (a low-sensitive photodiode read-out gate electrode) 3 are formed over the vertical CCD channels 2.

The vertical transfer electrode (the high-sensitive photodiode read-out gate electrode) 4 controls read-out of the signal charges from the high-sensitive photodiode 6 to the vertical CCD channel 2. Also, the vertical transfer electrode (the low-sensitive photodiode read-out gate electrode) 3 controls read-out of the signal charges from the low-sensitive photodiode 5 to the vertical CCD channel 2. Driving signals (transfer voltages) are imposed on both vertical transfer electrodes 3 and 4, and signal charges read out from each photosensitive region 30 to the vertical CCD channel 2 are transferred in a column direction (a vertical direction, that is, downward in FIG. 1A). The read-out and the transmission of the signal charges from the high-sensitive photodiode 6 and the read-out and the transmission of the signal charges from the low-sensitive photodiode 5 are carried out independently.

The isolation region 1 is formed along with the plurality of photosensitive regions 30 extending in the column direction (the vertical direction) and the vertical CCD channel 2 extending in the column direction (the vertical direction) and electrically isolates the photosensitive regions 30 and the vertical CCD channel 2 with those in the adjacent columns.

In the light receiving region, two vertical transmission electrodes 3 and 4 are covered with a light shielding film 9 having openings 8. The light shielding film 9 prevents light incident on a region other than the photosensitive region 30. Each of the openings 8 of the light shielding film 9 are formed over each photosensitive region 30, and exposes a part of the high-sensitive photodiode 6 and the low-sensitive photodiode 5. The opening 8 is formed to have a high opening ratio over the high-sensitive photodiode 6 and a low opening ratio over the low-sensitive photodiode 5. Incident light entering the light receiving region enters each photosensitive region 30 through the opening 8.

A color filter layer of one of three primary colors (red (R), green (G) and blue (B)) is formed above each opening 8 of the light shielding film 9. In FIG. 1A, a character "R" has been given to the opening 8 over which the red (R) color filter layer is formed. Also, the characters "G" and "B" are given where the green (G) or the blue (B) color filter is formed over the openings 8. Incident light entering the light receiving region enters the photosensitive regions 30 through the openings 8 (8R, 8G and 8B) after penetrating the color filter layer of one of the colors.

An absorption coefficient of silicon will be large when a wavelength becomes short in a visible range. Therefore, a green light enters into the silicon substrate deeper than a blue light, and a red light enters into the silicon substrate deeper than a green light. Sensitivity of the photodiode having a shallow conjunction depth will be high toward short wavelength light and low to long wavelength light.

The openings over the low-sensitive photodiodes 5 of the openings 8R into which a light going through the red (R) color filter layer enters are formed to be larger than the openings into which a light going through the green (G) color filter layer enters. The openings over the low-sensitive photodiodes 5 of the openings 8B into which a light going through the blue (B) color filter layer enters are formed to be smaller than the openings into which a light going through the green (G) color filter layer enters. In FIG. 1A, a case that a color of the color filter layer of the opening over the low-sensitive photodiode 5 of the openings 8 (8R, 8G and 8B) is largely formed in the order of red (R), green (G) and blue (B) is shown in the diagram. A size of the opening over the high-sensitive photodiode 6 of the openings 8 is, for example, same as all colors of the color filter layer.

For example, all the openings 8 of the light shielding film 9 are shaped in a rectangle of which a side extending in the row direction (a horizontal direction or a transverse direction in FIG. 1A) has a length of I. Further, the openings 8R, 8G or 8B, each of which light enters through the red (R), green (g) or blue (B) color filter layer, respectively, are formed so that sides over the low-sensitive photodiodes 5 in the sides extending in a column direction (a vertical direction of the drawing) have lengths $I_R$, $I_G$ and $I_B$, respectively, with a relationship represented by an equation $I_R > I_G > I_B$. In the present specification, a value of $I_R - I_G$ is defined as $\Delta I_R$ and is called opening enlargement $\Delta I_R$. Also, a value of $I_G - I_B$ is defined as $\Delta I_B$ and is called opening reduction.

Further, a structure shown in the diagram is a pixel arrangement with a honeycomb structure in which the plurality of photosensitive regions 30 shown in the diagram are arranged at a position shifted a ½ pitch in the column direction (vertical direction) and the row direction (horizontal direction).

Figure 1B:
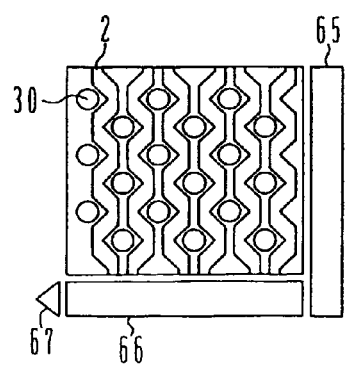
FIG. 1B is a schematic plan view showing a structure of the solid state imaging device having the light receiving region shown in FIG. 1A.

FIG. 1B is a schematic plan view showing a structure of the solid state imaging device having the light receiving region shown in FIG. 1A. The solid-state imaging device has a plurality of the photosensitive regions 30, for example, in the honeycomb arrangement, each including the two types of the photodiodes 5 and 6 of FIG. 1A, the vertical CCDs each including the vertical CCD channel 2 and the vertical transfer electrodes 3 and 4 of FIG. 1A, a horizontal CCD 66 electrically coupled with the vertical CCD, a driver 65 including wirings for driving the CCDs, and an amplifier circuit 67 formed on one end of the horizontal CCD 66 for amplifying output electric charge signals from the horizontal CCD 66.

In the photosensitive region 30, accumulated signal charges generated corresponding to the amounts of incident light that entered the high-sensitive photodiode and the low-sensitive photodiode are read out to the vertical CCD channel 2 independently. Then, the read-out signal charges are transmitted in the direction of the horizontal CCD 66 (vertical direction) in the vertical CCD channel 2. The signal charges are transmitted in the vertical CCD channel 2 by the driving signals (transmission voltages) provided from the driving part 65. The signal charges transmitted up to the end of the vertical transmission channel 2 are then horizontally transmitted in the horizontal CCD 66 (i.e., in a horizontal CCD channel that forms the horizontal CCD channel together with horizontal transfer electrodes) and amplified and read out by the amplifying circuit 67.

Figure 1C:
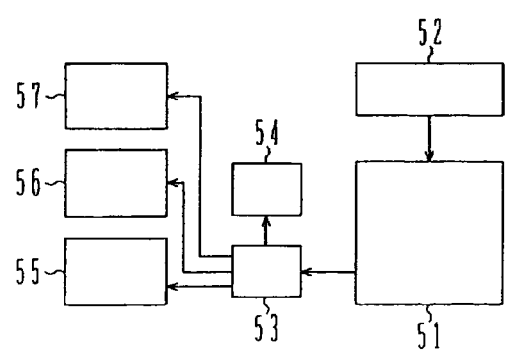
FIG. 1C is a schematic block diagram showing a main part of a solid state imaging apparatus including the solid state imaging device.

FIG. 1C is a schematic block diagram showing a main part of a solid state imaging apparatus including the solid state imaging device. The solid-state imaging apparatus includes: the solid-state imaging device 51 that is formed with a semiconductor chip, the solid-state imaging device 51 including the light receiving region and the peripheral circuit region, generating a signal charge in accordance with an amount of an incident light for each of two types of the photodiodes in the photosensitive region, and transferring and supplying two types of image signals based on the generated signal charges independently; a driving signal device 52 that supplies driving signals (transfer voltages, etc.) for driving the solid-state imaging device 51; an output signal processing device 53 that executes processes such as a noise reduction process, a white balance process, a data compression process, etc. to the two types of the image signals (the image signals based on the high-sensitive photodiodes 6 and the low-sensitive photodiodes 5); a storage device 54, for example a memory card, that is connected to the output signal processing device 53 and stores the image signals; a displaying device 55, for example a liquid crystal display, that displays an image based on the image signals; a communication device 56 that is an interface for transmitting the image signals outside; and if necessary a television device 57 that displays an image based on the image signals.

The signals provided from the driving signal device 52 to the solid-state imaging device 51 are horizontal CCD driving signals, vertical CCD driving signals, output amplifier driving signals, a substrate bias signal and the like. Also, a signal for reading out an accumulated electric charge of the high-sensitive photodiode 6 and the low-sensitive photodiode 5 to the vertical CCD channel 2 is provided.

The storage device 54 receives image signals from the output signal processing device 53 and has two storage areas. One of the areas stores the image signals based on the high-sensitive photodiodes 6, and another one stores the image signals based on the low-sensitive photodiodes 5.

Further, the entire contents of U.S. patent application Ser. No. 10/348,771 filed on Jan. 23, 2003 and U.S. patent application Ser. No. 10/715,484 filed on Nov. 19, 2003 are incorporated herein by reference.

Figure 2A:
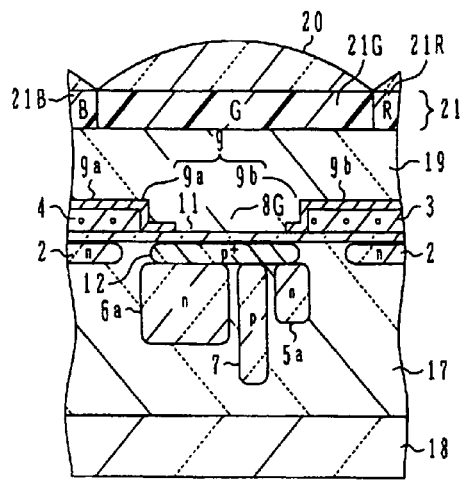
FIG. 2A, FIG. 2B and FIG. 2C are cross sectional views along lines 2A-2A, 2B-2B and 2C-2C in FIG. 1A.
Figure 2B:
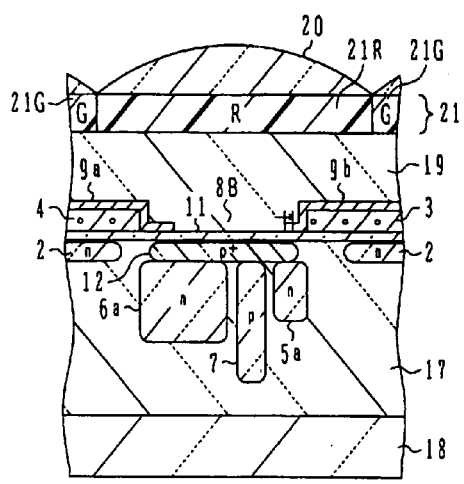
Figure 2C:
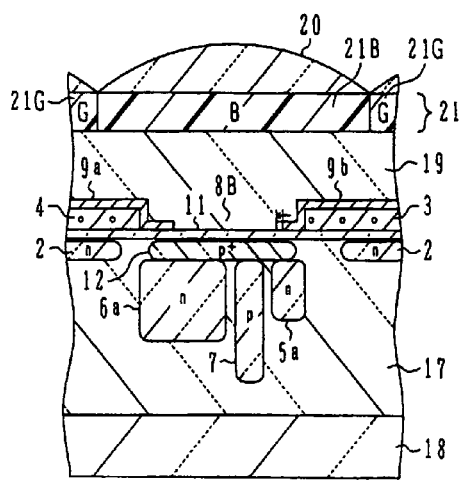

FIG. 2A, FIG. 2B and FIG. 2C are cross sectional views along lines 2A-2A, 2B-2B and 2C-2C in FIG. 1A.

In FIG. 2A, a cross section of a pixel wherein a green color filter layer 21G is formed in the upper part is shown.

For example, a p-type well 17 is formed on a surface of a semiconductor substrate 18 that is an n-type silicon substrate. The p-type well 17 is formed by ion-implantation of p-type impurities, for example, boron.

Near the surface of the p-type well 17, n-type impurity layers 5a and 6a are formed, and they have photodiodes with different sensitivities. The relatively large (the high-sensitive photodiode) n-type impurity layer 6a composes the high-sensitive photodiode 6, and the relatively small (the low-sensitive photodiode) n-type impurity layer 5a composes the low-sensitive photodiode 5. The conjunction depth of the low-sensitive photodiode 5 is shallower than that of the high-sensitive photodiode 6.

The two n-type impurity layers 5a and 6a are formed, for example, by an annealing process after the aforementioned ion-implantation. The dose amount is, for example, $1.0\times10^{12}$~$1.0\times10^{13}$ cm$^{-2}$. Phosphorus and arsenic may be used as the n-type impurities to be added. The conjunction depth of the n-type impurity layer 5a with small area tends to be shallower than the conjunction depth of the n-type impurity layer 6a with large area. This tendency becomes stronger as a pixel is miniaturized.

The photodiode isolation region 7 is formed by ion-implantation of the p-type impurities, for example, boron. As described above, the (high-sensitive photodiode) n-type impurity layer 6a and the (low-sensitive photodiode) n-type impurity layer 5a are electrically isolated. The dose amount of the p-type impurities in the photodiode isolation region 7 is, for example, $1.0\times10^{12}$~$1.0\times10^{13}$ cm$^{-2}$.

Further, a $p^+$-type impurity layer 12 is a buried region to isolate two photodiodes 5 and 6 from the surface of the substrate. The n-type impurity layers 5a and 6a, which are electrical charge accumulating regions, are separated from the surface in order to avoid a white scar, etc and to keep a good S/N ratio.

The vertical CCD channel 2, which is a region where n-type impurities, for example phosphorus, are added, is positioned near the n-type impurity layers 5a and 6a composing photodiodes. The n-type impurity layers 5a and 6a and the vertical CCD channel 2 have a similar composition as the source and drain of the MOS transistor.

On a surface of the semiconductor substrate 18, a gate insulating film 11 made of an ONO film formed by sequentially, from a bottom to a top, laminating a silicon oxide film made by thermal oxidation of the surface of the semiconductor substrate 18, a silicon nitride film made by, for example, CVD, and a silicon oxide film made by thermal oxidation of a surface of the silicon nitride, film are formed. Furthermore, thereon, the vertical transfer electrodes (the high-sensitive photodiodes read-out gate electrodes) 4 and the vertical transfer electrodes (the low-sensitive photodiodes read-out gate electrodes) 3 made of, for example, poly-silicon, are formed. Each of the vertical transmission electrodes 3 and 4 is positioned to cover the vertical CCD channel 2.

The (high-sensitive photodiode) n-type impurity layer 6a, the vertical CCD channel 2 below the vertical transmission electrode (high-sensitive photodiode read-out gate electrode) 4 and a p-type well 17 therebetween compose a read-out transistor from the high-sensitive photodiode 6 to the vertical CCD channel 2. Also, the (low-sensitive photodiode) n-type impurity layer 5a, the vertical CCD channel 2 below the vertical transmission electrode (low-sensitive photodiode read-out gate electrode) 3 and a p-type well 17 therebetween compose a read-out transistor from the low-sensitive photodiode 5 to the vertical CCD channel 2. Therefore, the signal charges from two photodiodes 5 and 6 (n-type impurity layers 5a and 6a) are read-out in directions different from each other.

The light shielding film 9 is formed over the vertical transmission electrodes 3 and 4 via an insulating film by, for example, tungsten. The light shielding film 9 over the vertical transmission electrode (low-sensitive photodiode read-out gate electrode) 3 is called a low-sensitive photodiode light shielding film 9b, and the light shielding film 9 over the vertical transmission electrode (high-sensitive photodiode read-out gate electrode) 4 is called a high-sensitive photodiode light shielding film 9a. The light shielding film 9 has openings 8G over two photodiodes 5 and 6 in the photosensitive region 30, the incident light to the light receiving region enters two photodiodes 5 and 6 from the openings 8G. The photodiode isolation region 7 prevents the electric charge accumulated in each of two photodiodes 5 and 6 from being mixed.

A planarizing layer 19 is formed over a gate insulating film 11, the vertical transmission electrodes 3 and 4, and the light shielding film 9 with insulating materials, for example silicon oxide (SiO). A color filter layer 21 is formed on the planarizing layer 19. The color filter layer 21 consists of, for example, a red color filter layer 21R, a green color filter layer 21G and a blue color filter layer 21B. Each color of the color filter layers 21 is positioned in a pixel so that only the light that penetrates a fixed colored color filter layer 21 can enter the pixel. A microlens 20 is formed corresponding to each photosensitive region 30 by resist material and the like. The microlens 20 focuses the incident light on the photosensitive region 30 and improves light concentrating efficiency.

Next, FIG. 2B and FIG. 2C are described. In FIG. 2B and FIG. 2C, cross sections of pixels wherein the red color filter layer 21R and the blue color filter layer 21B are formed over each of (the openings 8 of) the light shielding films 9a and 9b are shown.

In a case of FIG. 2B, as compared to the pixels having the green color filter layer 21G over the pixel shown in FIG. 2A, the light shielding part of the low-sensitive photodiode light shielding film 9b is made to be small, and the large opening over the low-sensitive photodiode 5 of the openings 8R is formed. The red light is not sufficiently absorbed in the shallow (low-sensitive photodiode) n-type impurity layer 5a and deeply enters into the semiconductor substrate 18, and there are many component that will be invalid. The openings 8R are enlarged in order to balance the photoelectric conversion efficiencies of a red light with that of a green light.

On the other hand, in a case of FIG. 2C, the light shielding part of the low-sensitive photodiode light shielding film 9b is made to be large, and the small opening over the low-sensitive photodiode 5 of the openings 8B is formed. The blue light does not enter deeply into the semiconductor substrate 18 and is sufficiently absorbed in the (low-sensitive photodiode) n-type impurity layer 5a. The openings 8B are narrowed in order to balance the photoelectric conversion efficiencies of a blue light with that of a green light.

By doing those, the amount of red light entering the low-sensitive photodiode 5 can be increased, or the amount of blue light can be decreased, and correction of the balance of spectrum sensitivity at a time of exposure becomes possible. It can be prevented that color S/N ratio of the solid-state imaging device and the quality of pictures decrease.

In FIG. 2B and FIG. 2C, conditions when the openings over the low-sensitive photodiode 5 is formed to be large and small are presented by arrows.

Further, the components shown in FIG. 2A to FIG. 2C, other than the color of the color filter layer 21 formed over (the opening 8 of) the light shielding film 9 and the size of the light shielding part of the low-sensitive photodiode light shielding film 9b, are common to all of the examples.

Figures 3A, 3B:
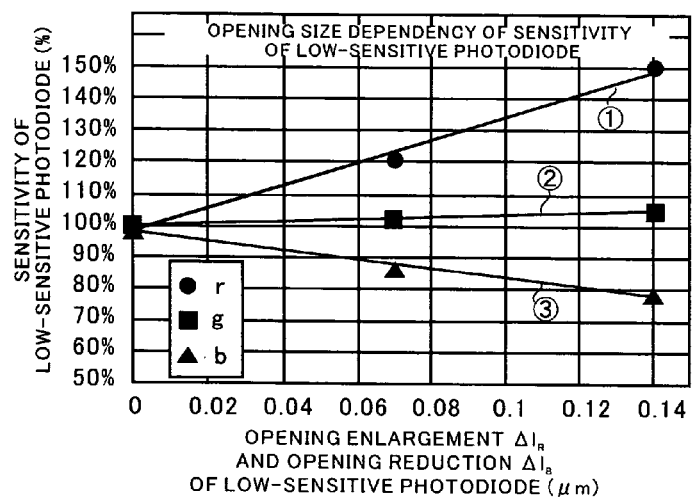
FIG. 3A is a chart showing changes in sensitivity of a low-sensitive photodiode in accordance with changes of opening enlargement $\Delta I_R$ and opening reduction $\Delta I_B$.
FIG. 3B is a graph showing changes in sensitivity of the low-sensitive photodiode in accordance with changes of opening enlargement $\Delta I_R$ and opening reduction $\Delta I_B$.

FIG. 3A is a chart showing changes in sensitivity of the low-sensitive photodiode in accordance with changes of opening enlargement $\Delta I_R$ and opening reduction $\Delta I_B$. FIG. 3B is a graph showing changes in sensitivity of the low-sensitive photodiode in accordance with changes of opening enlargement $\Delta I_R$ and opening reduction $\Delta I_B$.

The opening 8R over the low-sensitive photodiode 5 is enlarged by increasing the opening enlargement $\Delta I_R$, and an amount of incident light that penetrated the red color filter layer 21R into the low-sensitive photodiode 5 (n-type impurity layer 5a) is increased. Also, the opening 8B over the low-sensitive photodiode 5 is reduced by increasing the opening reduction $\Delta I_B$, and an amount of incident light that penetrated the blue color filter layer 21B into the low-sensitive photodiode 5 (n-type impurity layer 5a) is decreased. Further, the size of the opening 8G of the light shielding film 9 below the green color filter layer 21G is fixed.

Here, FIG. 3A is described. Changes in Red-sensitivity (called r-sensitivity), in Green-sensitivity (called g-sensitivity) and in Blue-sensitivity (called b-sensitivity) of the low-sensitive photodiode by changing the opening enlargement $\Delta I_R$ and the opening reduction $\Delta I_B$ have been measured. Measured values are standardized as 100% at a time that the opening enlargement $\Delta I_R$ and the opening reduction $\Delta I_B$ are 0 μm. Both the opening enlargement $\Delta I_R$ and the opening reduction $\Delta I_B$ are 0.07 μm, r-sensitivity is 119%, g-sensitivity is 103% and b-sensitivity is 86%. Also, both of the opening enlargement $\Delta I_R$ and the opening reduction $\Delta I_B$ are 0.14 μm, r-sensitivity is 149%, g-sensitivity is 105% and b-sensitivity is 80%.

Here, FIG. 3B is described. Based on the result in FIG. 3A, the opening enlargement $\Delta I_R$ and the opening reduction $\Delta I_B$ are expressed with the unit "μm" along the horizontal axis, and the low-sensitive photodiode sensitivity is expressed with "%" along the vertical axis to make a graph. Each of a graph 1, a graph 2 and a graph 3 shows opening-size dependency of each of r-sensitivity, g-sensitivity and b-sensitivity.

The r-sensitivity and the b-sensitivity are considered to be linearly changed depending on the opening enlargement $\Delta I_R$ and the opening reduction $\Delta I_B$. When the opening enlargement $\Delta I_R$ and the opening reduction $\Delta I_B$ increase, the r-sensitivity linearly increases, whereas the b-sensitivity linearly decreases. Also, it is found out that the g-sensitivity hardly changes. The g-sensitivity hardly changes because the size of the opening 8G of the light shielding film 9 below the green color filter layer 21G is fixed.

Figures 4A, 4B:
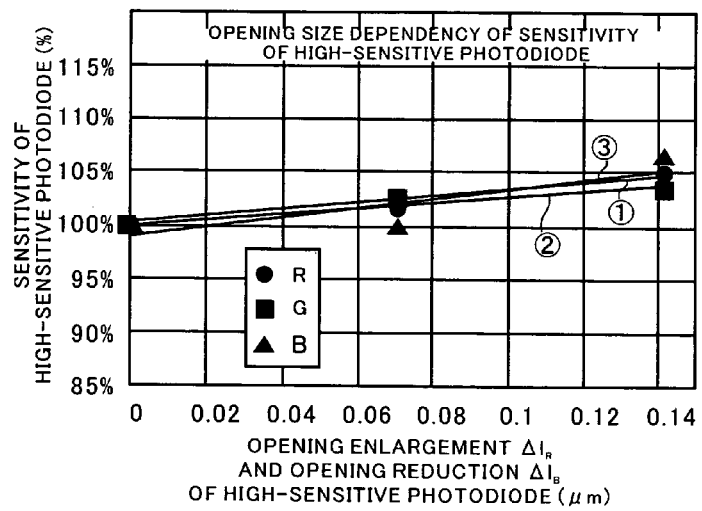
FIG. 4A is a chart showing changes in sensitivity of a high-sensitive photodiode to changes of the opening enlargement $\Delta I_R$ and the opening reduction $\Delta I_B$.
FIG. 4B is a graph showing changes in sensitivity of the high-sensitive photodiode to changes of the opening enlargement $\Delta I_R$ and the opening reduction $\Delta I_B$.

FIG. 4A is a chart showing changes in sensitivity of the high-sensitive photodiode to a change in the opening enlargement $\Delta I_R$ and the opening reduction $\Delta I_B$. FIG. 4B is a graph showing changes in sensitivity of the high-sensitive photodiode to a change in the opening enlargement $\Delta I_R$ and the opening reduction $\Delta I_B$. Measurements are carried out with the same method as that at a time of FIG. 3A and FIG. 3B.

Here, FIG. 4A is described. Changes in Red-sensitivity (called R-sensitivity), Green-sensitivity (called G-sensitivity) and Blue-sensitivity (called B-sensitivity) of the high-sensitive photodiode by changing the opening enlargement $\Delta I_R$ and the opening reduction $\Delta I_B$ are measured. Measured values are standardized as 100% at a time that the opening enlargement $\Delta I_R$ and the opening reduction $\Delta I_B$ are 0 μm. When both the opening enlargement $\Delta I_R$ and the opening reduction $\Delta I_B$ are 0.07 μm, R-sensitivity is 102%, G-sensitivity is 103% and B-sensitivity is 99%. Also, when both the opening enlargement $\Delta I_R$ and the opening reduction $\Delta I_B$ are 0.14 μm, R-sensitivity is 105%, G-sensitivity is 103% and B-sensitivity is 107%.

Here, FIG. 4B is described. Based on the result in FIG. 4A, the opening enlargement $\Delta I_R$ and the opening reduction $\Delta I_B$ are expressed with the unit "μm" along the horizontal axis, and the high-sensitive photodiode sensitivity is expressed with "%" along the vertical axis to make a graph. Each of a graph 1, a graph 2 and a graph 3 shows opening-size dependency of each of R-sensitivity, G-sensitivity and B-sensitivity.

All high-sensitive photodiode sensitivities of the R-sensitivity, the G-sensitivity and the B-sensitivity are almost fixed without dependence on the opening size (the opening enlargement $\Delta I_R$ and the opening reduction $\Delta I_B$) over the low-sensitive photodiode.

Figures 5A, 5B:
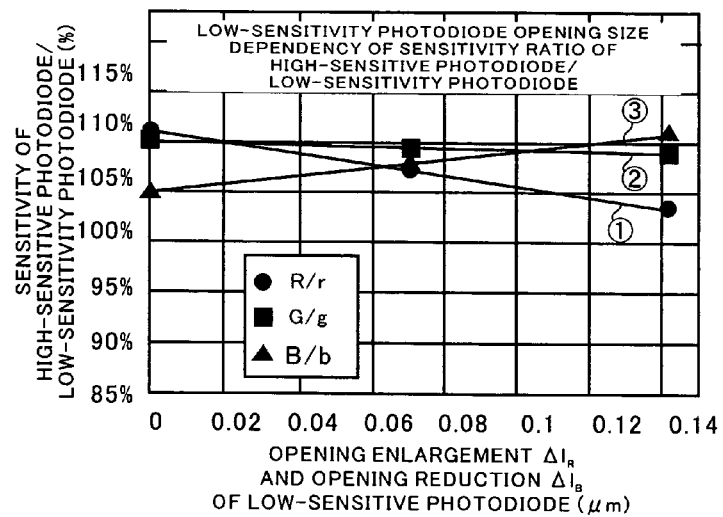
FIG. 5A is a chart showing calculated results of values of R-sensitivity/r-sensitivity, G-sensitivity/g-sensitivity and B-sensitivity/b-sensitivity from the results shown in FIG. 3A and FIG. 4A.
FIG. 5B is a graph showing changes in the sensitivity ratio to opening enlargement $\Delta I_R$ and opening reduction $\Delta I_B$.

FIG. 5A is a chart showing calculated result of values of R-sensitivity/r-sensitivity, G-sensitivity/g-sensitivity and B-sensitivity/b-sensitivity from the results shown in FIG. 3A and FIG. 4A. FIG. 5B is a graph showing changes in the sensitivity ratio to the opening enlargement $\Delta I_R$ and the opening reduction $\Delta I_B$.

Here, FIG. 5A is described. Values of R-sensitivity/r-sensitivity, G-sensitivity/g-sensitivity and B-sensitivity/b-sensitivity are calculated according to the change in the opening enlargement $\Delta I_R$ and the opening reduction $\Delta I_B$, and the result is presented in the chart. When each of the opening enlargement $\Delta I_R$ and the opening reduction $\Delta I_B$ is 0 μm, the values of R-sensitivity/r-sensitivity, G-sensitivity/g-sensitivity and B-sensitivity/b-sensitivity are 104%, 100% and 79% in order. When each of the opening enlargement $\Delta I_R$ and the opening reduction $\Delta I_B$ is 0.07 μm, the values of R-sensitivity/r-sensitivity, G-sensitivity/g-sensitivity and B-sensitivity/b-sensitivity are 89%, 100% and 91% in order. When each of the opening enlargement $\Delta I_R$ and the opening reduction $\Delta I_B$ is 0.14 μm, the values are 74%, 96% and 105% in order.

Here, FIG. 5B is described. Based on the result from FIG. 5A, the opening enlargement $\Delta I_R$ and the opening reduction $\Delta I_B$ are expressed with the unit "μm" along the horizontal axis, and R-sensitivity/r-sensitivity, G-sensitivity/g-sensitivity and B-sensitivity/g-sensitivity are expressed with "%" along the vertical axis to make a graph. Each of a graph 1, a graph 2 and a graph 3 shows opening-size dependency of each of R-sensitivity/r-sensitivity, G-sensitivity/g-sensitivity and B-sensitivity/b-sensitivity.

The values of R-sensitivity/r-sensitivity and B-sensitivity/b-sensitivity are considered to be linearly changed depending on the opening enlargement $\Delta I_R$ and the opening reduction $\Delta I_B$. When the opening enlargement $\Delta I_R$ and the opening reduction $\Delta I_B$ increase, the value of R-sensitivity/r-sensitivity linearly decreases, and the value of B-sensitivity/b-sensitivity linearly increases. Also, it is found out that G-sensitivity/g-sensitivity hardly changes.

Dispersion of sensitivity ratios of each color, R-sensitivity/r-sensitivity, G-sensitivity/g-sensitivity and B-sensitivity/b-sensitivity in the case that the opening enlargement $\Delta I_R$ for the opening over the red color filter layer is 0.07 μm and the opening reduction $\Delta I_B$ for the opening over the blue color filter layer is 0.07 μm, is smaller than the case that area of the opening over the low-sensitive photodiode is fixed (the case that both of the opening enlargement $\Delta I_R$ and the opening reduction $\Delta I_B$ are 0 μm). That is, spectrum sensitivity between the low-sensitive photodiode and the high-sensitive photodiode approaches, and the spectrum sensitivity is balanced.

Based on the results shown in FIG. 3 to FIG. 5, by adjusting areas of the openings over the low-sensitive photodiode and adjusting the amount of the incident light into the low-sensitive photodiode, it is found that spectrum sensitivity of the solid state imaging device can be controlled.

Although it depends on the conjunction depth of the n-type impurity layer composing the low-sensitive photodiode, when an area of the opening over the low-sensitive photodiode into which the incident light penetrated the red color filter enters is in a range of 100% to 140% of the area of the opening over the low-sensitive photodiode into which the incident light penetrated the green color filter enters, the spectrum sensitivity of the solid state imaging device can be preferably improved. Also, when an area of the opening over the low-sensitive photodiode into which the incident light penetrated the blue color filter enters is in a range of 60% to 100% of the area of the opening over the low-sensitive photodiode into which the incident light penetrated the green color filter enters, the spectrum sensitivity of the solid state imaging device can be preferably improved.

Although when the data in FIG. 3 to FIG. 5 have been sampled, the size of the opening 8G where light penetrated the green color filter 21G enters into has been fixed, the size of the openings 8G may be varied to satisfy a condition that the openings over the low-sensitive photodiodes 5 of the openings 8R into which a light going through the red (R) color filter layer 21R enters are formed to be larger than the openings into which a light going through the green (G) color filter layer 21G enters, or that the openings over the low-sensitive photodiodes 5 of the openings 8B into which a light going through the blue (B) color filter layer 21B enters are formed to be smaller than the openings into which a light going through the green (G) color filter layer 21G enters. In that case too, improvement and adjustment of spectrum sensitivity can be realized.

In the first embodiment of the present invention, by changing the sizes of the openings of the low-sensitive photodiode light shielding film 9b and adjusting the sizes of the openings over the low-sensitive photodiode 5 of the openings 8 of the light shielding film 9, the spectrum sensitivity of the solid state imaging device can be controlled by making the amount of red light that enters into the low-sensitive photodiode 5 increase or making blue light decrease. By changing the size of the light shielding part of the high-sensitive photodiode light shielding film 9a and adjusting the size of the opening over the high-sensitive photodiode 6 of the openings 8 of the light shielding film 9, the spectrum sensitivity also can be controlled. For example, in the pixels that red light enters into, by making the light shielding part of the high-sensitive photodiode light shielding film 9a small and the size of the opening over the high-sensitive photodiode 6 of the openings 8R of the light shielding film 9 large, the amount of red light that enters into the high-sensitive photodiode 6 is increased. In the pixels that blue light enters into, adjustment contrary to the above-described adjustment is performed.

By adjusting the size of the opening of the light shielding film for every color of the color filter over the pixels, the spectrum sensitivity of the solid state imaging device can be controlled. Especially in the solid state imaging device wherein the plural types of photodiodes with different spectrum sensitivity are provided, the spectrum sensitivity can be adjusted to a fixed value and improved without changing composition of the photodiode and the color filter. By adjusting a sensitivity ratio of the high-sensitive photodiode and the low-sensitive photodiode, balance of the spectrum sensitivity can be improved. Therefore, an image with small image deterioration can be obtained. For example, deterioration of a color S/N ratio can be prevented after white balance correction.

In the first embodiment of the present invention, although the incident light into the pixel is separated with the color filters of 3 primary colors, it is not limited only to separate colors into red (R), green (G) and blue (B). Also, it is not limited only to separate into 3 colors.

When the incident light is separated into a plurality of colors including a color of a first wave, a color of a second wave that is shorter than the first wave and a color of a third color that is shorter than the second wave, the opening over the low-sensitive photodiode, through which the light with the color of the first wave enters, is larger than the opening over the low-sensitive photodiode, through which the light with the color of the second wave enters. Also, by making the opening over the low-sensitive photodiode that the light with the color of the third wave enters smaller than the opening over the low-sensitive photodiode that the light with the color of the second wave enters, the spectrum sensitivity of the solid state imaging device can be adjusted to improve.

Figure 6:
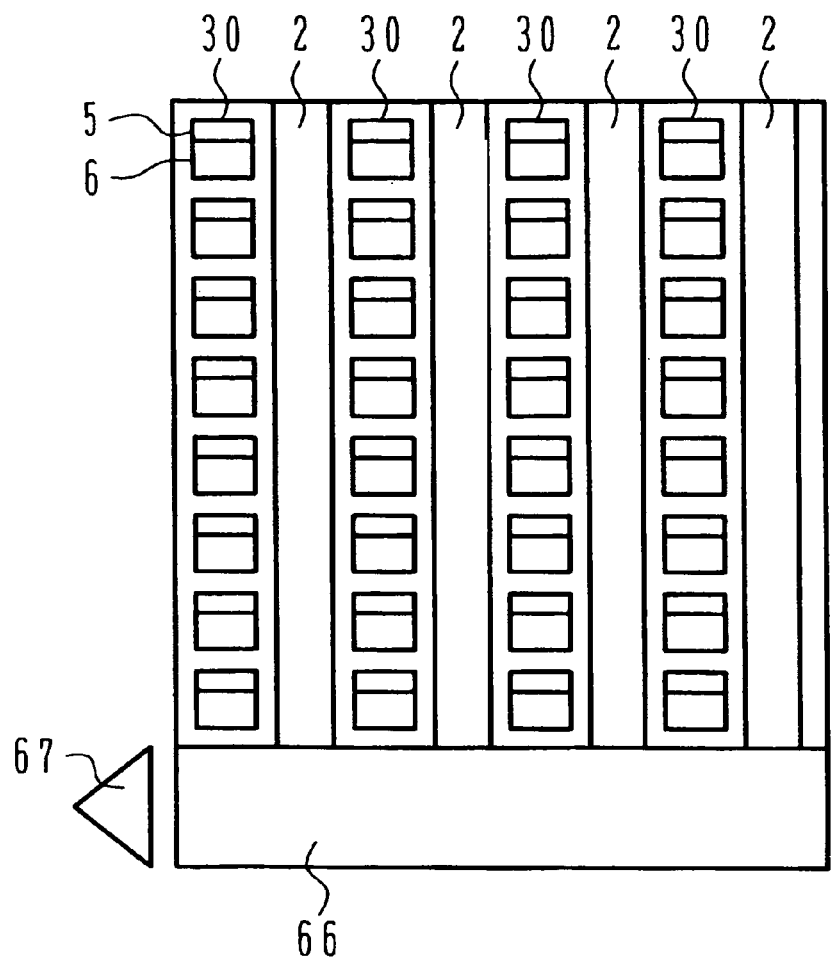
FIG. 6 is a schematic plan view showing a solid state imaging device wherein each pixel includes a high-sensitive photodiode and a low-sensitive photodiode, all pixels are arranged in a tetragonal matrix, and electric charges can be selectively transmitted from two types of photodiodes to an adjacent vertical CCD channel.

The first embodiment has been described as an example of the solid state imaging device with the honeycomb structure. The pixel arrangement of the solid state imaging device is not limited only to the honeycomb structure. As shown in FIG. 6, each photosensitive region 30 may include the high-sensitive photodiode and the low-sensitive photodiode, and all the photosensitive regions 30 are arranged in a tetragonal matrix. Then the solid state imaging device may have a structure that can selectively transmit electric charge to the adjusting vertical CCD channel 2 from the 2 types of the photodiodes.

Figure 7:
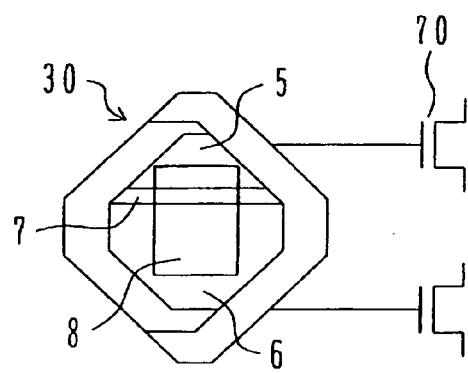
FIG. 7 is a schematic plan view showing a solid state imaging device wherein each pixel includes a high-sensitive photodiode and a low-sensitive photodiode, MOS transistors are connected corresponding to the high-sensitive photodiode and the low-sensitive photodiode, and an accumulated electric charge of each photodiode can selectively be read out.

Further, the first embodiment can be applied to a solid state imaging device other than the CCD-type solid state imaging device. As shown in FIG. 7, the solid state imaging device may be a solid state imaging device with a structure wherein each photosensitive region 30 includes the high-sensitive photodiode 6 and the low-sensitive photodiode 5, MOS transistors 70 are connected in correspondence to the high-sensitive photodiode 6 and the low-sensitive photodiode 5, and accumulated electric charge in each photodiode can be selectively read-out.

Further, an example that two types of photodiodes, those are the high-sensitive photodiode and the low-sensitive photodiode, are formed in a pixel is explained. The first embodiment can be applied to a solid state imaging device that either one of the high-sensitive photodiode or the low-sensitive photodiode is formed in a pixel.

Next, a second embodiment of the present invention will be explained.

The inventors of the present invention executed a Finite Differential Time Domain Method (FDTD) considering a wave-optical effect, instead of a ray tracing simulation based on the conventional geometric optics, and analyzed a mechanism of sensitivity decline and color shading at a peripheral area of the solid-state imaging device. As a result, it became clear that light concentrating efficiency of each pixel at a peripheral area of the element and miniaturized pixels is dependant on the wavelength of the incident light and a phenomenon that sensitivity of a light will be lower as a wavelength of the light (for example, red light (R)) gets longer.

FIGS. 8A to 8D are graphs showing a relationship between a pixel (cell) size at a time that an angle of the incident light is fixed and light concentrating efficiency when the incident light achieves a photoelectric conversion element through a micro-lens, a color filter and an opening of a light shielding film.

Figure 8A:
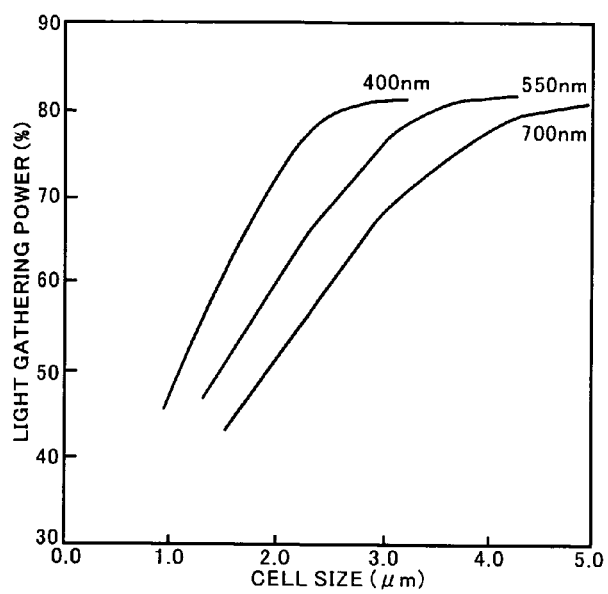
FIGS. 8A to 8D are graphs showing a relationship between a pixel (cell) size at a time that an angle of an incident light is fixed and light concentrating efficiency when the incident light enters a photoelectric conversion element through a micro-lens, a color filter and an opening of a light shielding film.
Figure 8B:
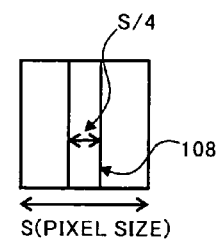

FIG. 8A is a graph showing the above relationship when the shape of the opening of the light shielding filter is a rectangle (ratio of the long side and short side is 1:4). It is obvious from the drawing, light concentrating efficiency of R (red light) that is the long wavelength light is attenuated when a pixel size is not more than 4 μm, and similarly that of G (green light) is attenuated when a pixel size is around 3 μm, and that of B (blue light) is attenuated when a pixel size is around 2.2 μm. Moreover, as shown in FIG. 8B, when one side length (pixel size) of the photoelectric conversion element is S, in the opening 108, a length in the vertical direction is S, and a length in the horizontal direction is S/4.

Figure 8C:
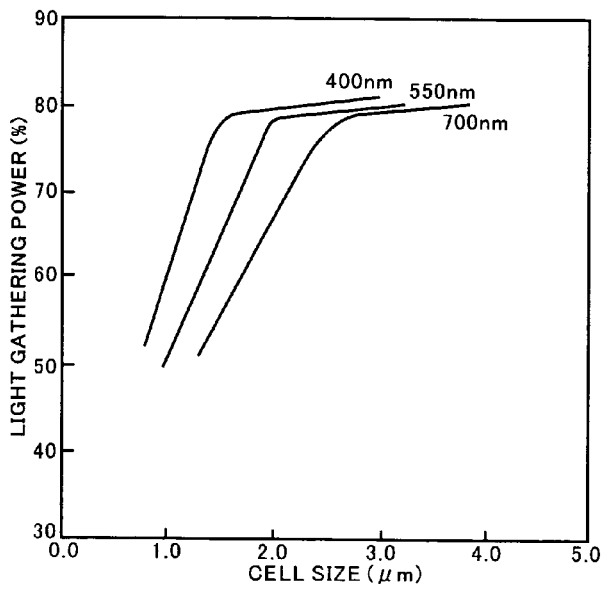
Figure 8D:
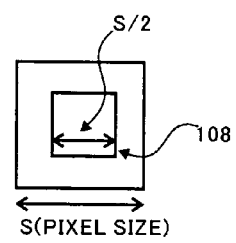

FIG. 8C is a graph showing the above relationship when the shape of the opening of the light shielding filter is a square. As obvious from the graph, light concentrating efficiency of R (red light) that is a long wavelength light is declined in a region that the pixel size is 2.5 μm or less, and as same as the case of R, each of light concentrating efficiency of G (green light) and B (blue light) is declined from each of about 2 μm and 1.4 μm. Moreover, as shown in FIG. 8D, when one side length (pixel size) of the photoelectric conversion element is S, in the opening 108, a length in the vertical direction is S/2, and a length in the horizontal direction is S/2.

When the case that the shape of the opening of the light shielding film is a rectangle and when it is a square are compared, a pixel size that decline of light concentrating efficiency begins is shifted in the smaller region than the rectangular case. That is, in the case of the same opening areas, the decline of light concentrating efficiency can be more efficiently controlled in the case of the square-shaped opening of the light shielding film than the case of the rectangular-shaped opening.

Also, even if in the center (a region that light incoming angle is vertical 90 degree) of a light receiving region of a solid-state imaging device, when the shape of the openings of the light shielding film is a square, in a region that the pixel size is 3 μm (when the shape of the openings of the light shielding film is rectangular, the pixel size is 4 μm) or less, it is ascertained that light concentrating efficiency of a light receiving element is dependent on a wavelength of incident light and the dependency affects color reproduction (color balance).

Further, it is ascertained that an angle of incident light becomes an oblique incident angle (θ) in the peripheral area of the solid-state imaging device and an effective opening size looked at from the light source is decreased (L sin θ). Therefore, in the same pixel size, attenuation of light concentrating efficiency will be clearer in the peripheral area of the light receiving region.

Thereupon, according to the second embodiment of the present invention, an opening area of the opening of the light shielding film corresponding to a short wave light receiving element (a photoelectric conversion element below the color filter (e.g., B) through which a short wave light passes) is set to be larger than an opening area of the opening of the light shielding film corresponding to a long wave light receiving element (a photoelectric conversion element below the color filter (e.g., R) through which a long wave light passes).

Figure 9:
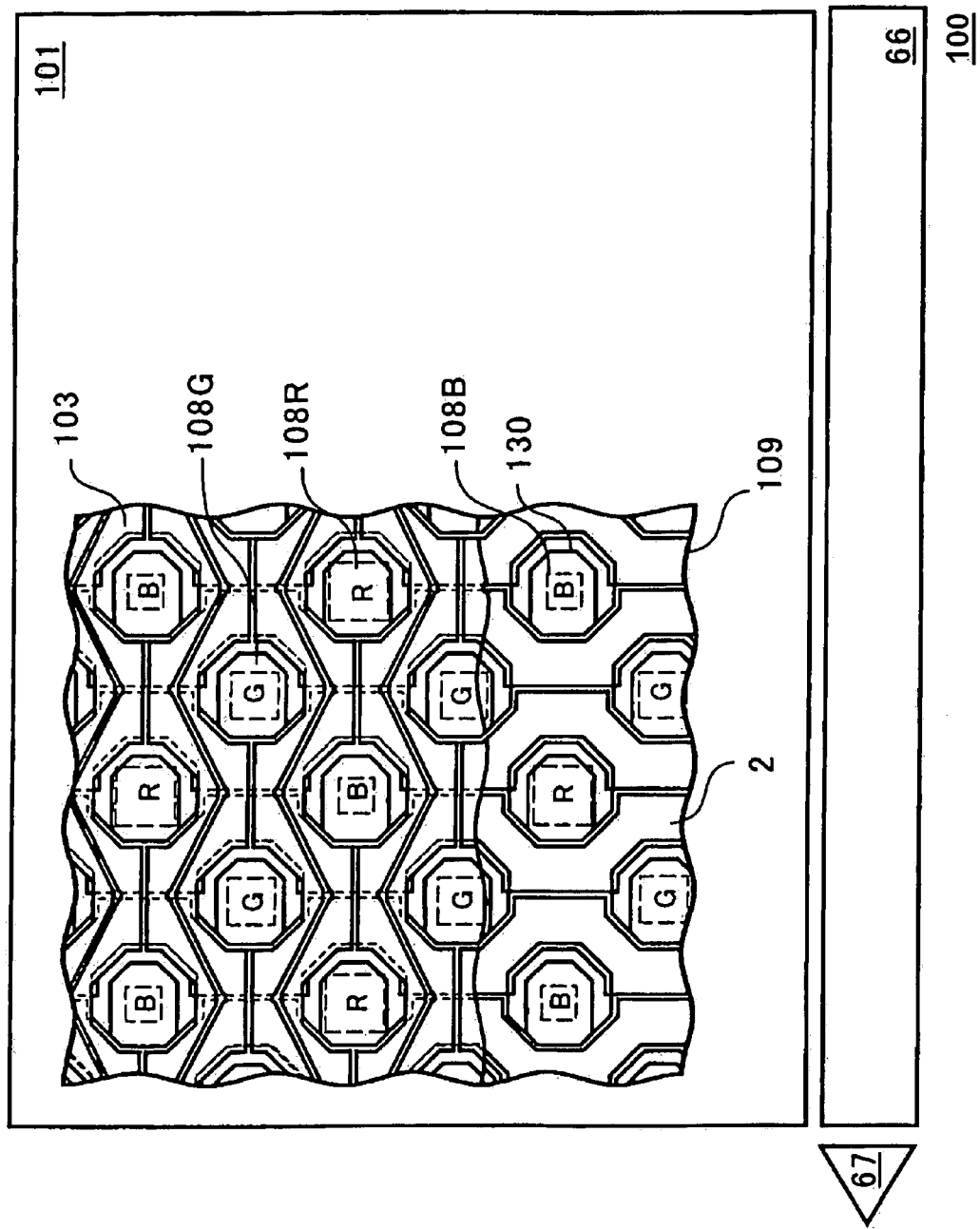
FIG. 9 is a block diagram showing a structure of a solid-state imaging device 100 according to a second embodiment of the present invention.

FIG. 9 is a block diagram showing a structure of a solid-state imaging device 100 according to the second embodiment of the present invention. The detailed explanation of the same parts as the first embodiment are omitted by attaching the same reference numbers.

As in the first embodiment, the solid-state imaging device 100 is, for example, provided with a plurality of photoelectric conversion elements 130 arranged in the honeycomb arrangement, vertical CCDs, each of which includes a vertical CCD channel 2 (and vertical transferring electrodes 103 positioned above the vertical CCD channel 2), and a horizontal CCD 66, the end of which is electrically connected to the vertical CCDs. Also, the solid-state imaging device 100 includes an amplified circuit 67 that amplifies an output electric charge signal from the horizontal CCD 66.

The signal charges generated corresponding to the amount of incident light are accumulated in the photoelectric conversion elements 130, and the signal charges are read out by the vertical CCD channel 2 and transferred in a direction (vertical direction) to the horizontal CCD part 66 in the vertical CCD channel 2. The signal electric charges transferred to the end of the vertical CCD channel 2 are transferred horizontally in the horizontal CCD 66 that is consisted of a horizontal CCD channel and horizontal transfer electrodes formed thereon, and are amplified by an amplifying circuit 67 before being output.

In the light receiving region 101, a plurality of the photoelectric conversion elements 130 is arranged, and the vertical CCD channel 2 is positioned on the right of each column of the photoelectric conversion elements 130. The vertical transferring electrodes 103 are formed over the vertical CCD channel 2. The vertical transferring electrodes 103 control reading out from the photoelectric conversion elements 130 to the vertical CCD channel 2. Driving signals (transferring voltages) are imposed on the vertical transferring electrodes 103, and the signal charges read from each of the photoelectric conversion elements 130 to the vertical CCD channels 2 are transferred in the column direction (vertical direction).

The light receiving region 101 is covered with the light shielding film 109 that has openings 108 (108R, 108G and 108B). The light shielding film 109 prevents light from entering a region other than the photoelectric conversion elements 130 in the light receiving region. The opening 108 of the light shielding film 109 is formed straight up over each photoelectric conversion element 130 to expose a part of the photoelectric conversion element 130. Incident light to the light receiving region enters into each of the photoelectric conversion elements 130 through each of the openings 108.

A color filter layer (color decomposing means) in either one color of three primary colors (red (R), green (G) or blue (B)) is formed above (the opening 108 of) the light shielding film 109. In FIG. 9, openings 108 having the red (R) color filter layer formed thereover are indicated by the letter "R", opening having the green (G) color filter layer formed thereover are indicated by the letter "G" and openings having the blue (B) color filter layer formed thereover are indicated by the letter "B". Incident light to the light receiving region enters into the photoelectric conversion elements 130 through the openings 108 (108R, 108G and 108B) after penetrating the color filter layer in either one of the colors.

The opening 108R into which a light (a short wavelength light) going through the red (R) color filter layer enters is formed to be larger than the opening 108B into which a light (a medium wavelength light) going through the green (G) color filter layer enters. The opening 108B which a light (a long wavelength light) going through the blue (B) color filter layer enters is formed to be smaller than the opening 108G into which a light going through the green (G) color filter layer enters.

Figure 10A:
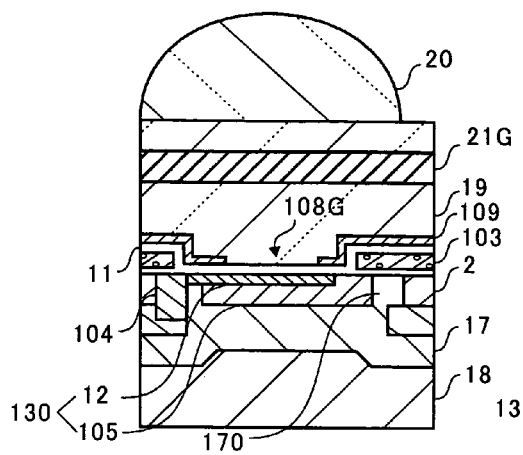
FIGS. 10A to 10C are cross sectional views showing parts of the solid-state imaging device according to the second embodiment of the present invention.
Figure 10B:
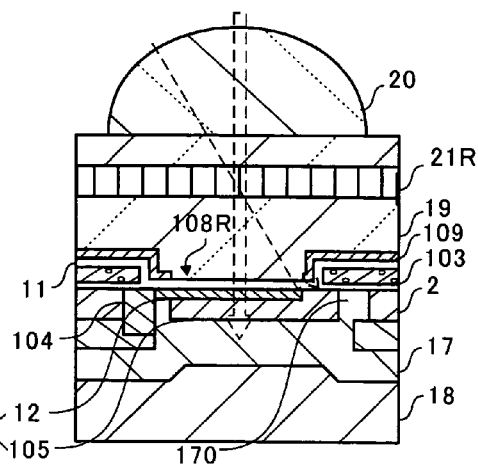
Figure 10C:
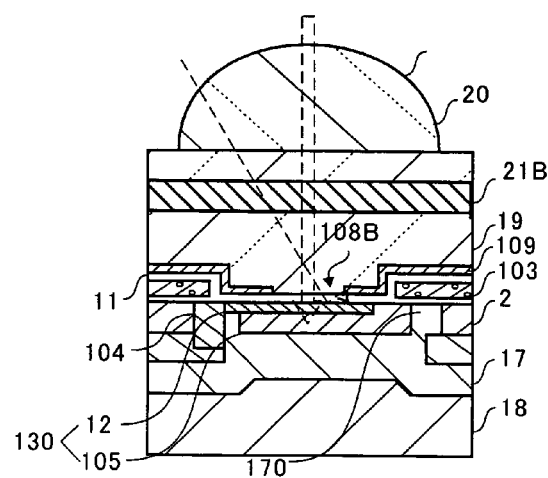

FIGS. 10A to 10C are cross sectional views showing parts of the solid-state imaging device 100 according to the second embodiment of the present invention.

FIG. 10A is a cross sectional view of the pixels wherein the green color filter layer 21G is formed above (the opening 108 of) the light shielding film 109.

For example, on a surface of the semiconductor substrate 18 that is an n-type silicon substrate, a p-type well 17 is formed. The p-type well 17 is made by, for example, ion-implantation of boron.

The photoelectric conversion elements 130 are formed by including an n-type impurity layer 105 and a p$^+$-type impurity layer 12. The n-type impurity layer 105 is formed near the surface of a p-type well 17, for example, by ion-implantation process. The dose amount is, for example, $1.0 \times 10^{12} \sim 1.0 \times 10^{13}$ cm$^{-2}$. Phosphorus and arsenic can be used as the n-type impurities to be added. The p$^+$-type impurity layer 12 is a buried region to isolate the n-type impurity layer 105 from the surface of the substrate. The n-type impurity layer 105, which is an electrical charge accumulating region, is separated from the surface in order to avoid a white scar, etc. and to keep a good S/N ratio.

The vertical CCD channel 2 that is a region added with n-type impurities (for example, phosphorus) is positioned near the photoelectric conversion element 130.

On a surface of the semiconductor substrate 18, a gate insulating film 11 made of an ONO film formed by sequentially laminating, from a bottom to a top, a silicon oxide film made by thermal oxidation of the surface of the semiconductor substrate 18, a silicon nitride film made by, for example, CVD, and a silicon oxide film made by thermal oxidation of a surface of the silicon nitride film are formed. Furthermore, thereon the vertical transfer electrodes (the read-out gate electrodes) 10 made of, for example, poly-silicon is formed. The vertical transmission electrodes 103 are positioned to cover the vertical CCD channel 2.

A read-out gate region 170 is formed between the n-type impurity layer 105 and the vertical CCD channel 2 below the vertical transmission electrode 103. A channel stop region 104 is formed near the photoelectric conversion element 130 that is opposite side of the read-out gate region 170.

A light shielding film 109 is formed of, for example, tungsten over the vertical transmission electrodes 103 via an insulating film. The light shielding film 109 has an opening 108G over the photoelectric conversion element 130, and the incident light to the light receiving region enters into the photoelectric conversion element 103 from the opening 108G.

A planarizing layer 19 is formed over a gate insulating film 11, the vertical transmission electrode 103, and the light shielding film 109 with insulating materials, for example silicon oxide (SiO). A color filter layer 21 is formed on the planarizing layer 19. The color filter layer 21 is consisted of, for example, a red color filter layer 21R, a green color filter layer 21G and a blue color filter layer 21B. The color filter 21 is positioned above the photoelectric conversion element 103 so that only the light that penetrates a colored color filter layer 21 can enter. A micro lens 20 is formed corresponding to each photoelectric conversion element 130 by resist material and the like. The micro lens 20 focuses the incident light on the photoelectric conversion element 130 and improves light concentrating efficiency.

In FIG. 10B and FIG. 10C, cross sectional views of pixels wherein the red color filter layer 21R and the blue color filter layer 21B are formed over each of (the openings 108 of) the light shielding films 109 are shown.

In a case of FIG. 10B, as compared to the pixels under the green color filter layer 21G shown in FIG. 10A, the large opening 108R is formed under the red color filter layer 21R.

In a case of FIG. 10C, as compared to the pixels under the blue color filter layer 21B shown in FIG. 10A, the small opening 108B is formed under the blue color filter layer 21B.

By setting a relationship of the opening areas 108RL, 108GL and 108BL of the openings 108R, 108G and 108B to be 108RL>108GL>108BL, decline of light concentrating efficiency depending on the wavelength of the incident light described before with reference to FIG. 8 can be controlled.

Also, as shown with a dotted arrow in the drawing, a short wavelength light (for example, light passing through the blue color filter 21B) is absorbed at relatively a shallow part of the light receiving silicon substrate to generate a signal electric charge. Therefore, as shown with the dotted arrow, when the incident light enters in the direction of the read-out gate 170 or the adjacent photoelectric conversion elements 130, it causes smear. In order to prevent the above problems, it is necessary that the opening area of the opening 108G under the blue color filter layer 21 is set to be relatively small, as compared to other openings 108G and the openings 108R.

On the other hand, a long wavelength light (for example, light passing through the red color filter 21R) is absorbed at relatively a deep part of the light receiving silicon substrate to generate a signal electric charge, and the signal electric charge generated at the deep part is considered to be a main cause of the smear. Therefore, even if the opening 108R is set to be large relatively, it is considered that it is not a cause of the smear by the signal electric charge generated at relatively a shallow part of the light receiving silicon substrate.

Moreover, the structures shown in FIG. 10A to FIG. 10C, other than the color of the color filter layer 21 formed above (the opening 108 of) the light shielding film 109 and the size of the opening 108G, 108R and 108B, are common to all.

Figure 11A:
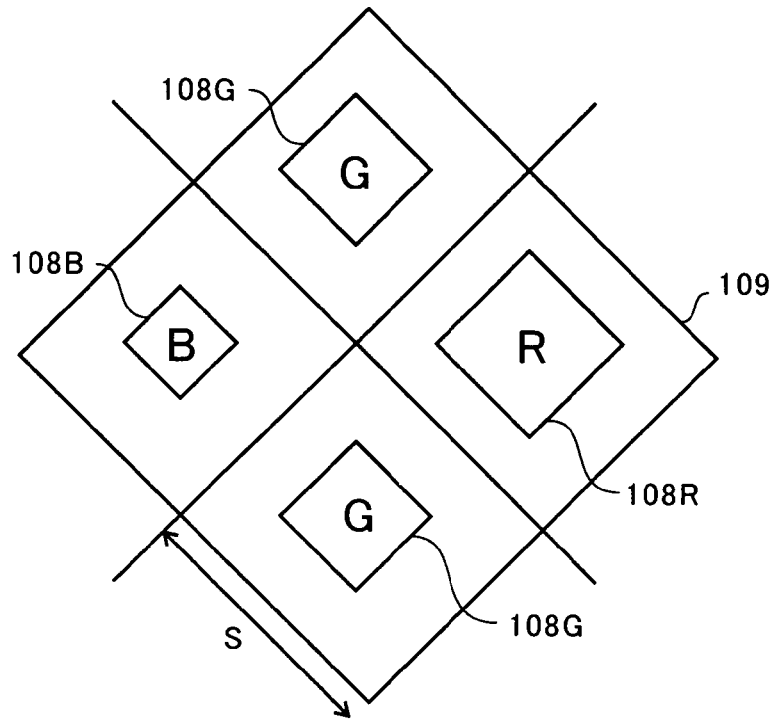
FIG. 11A and 11B are plan views showing shapes of openings and opening areas of the openings according to the second embodiment of the present invention.
Figure 11B:
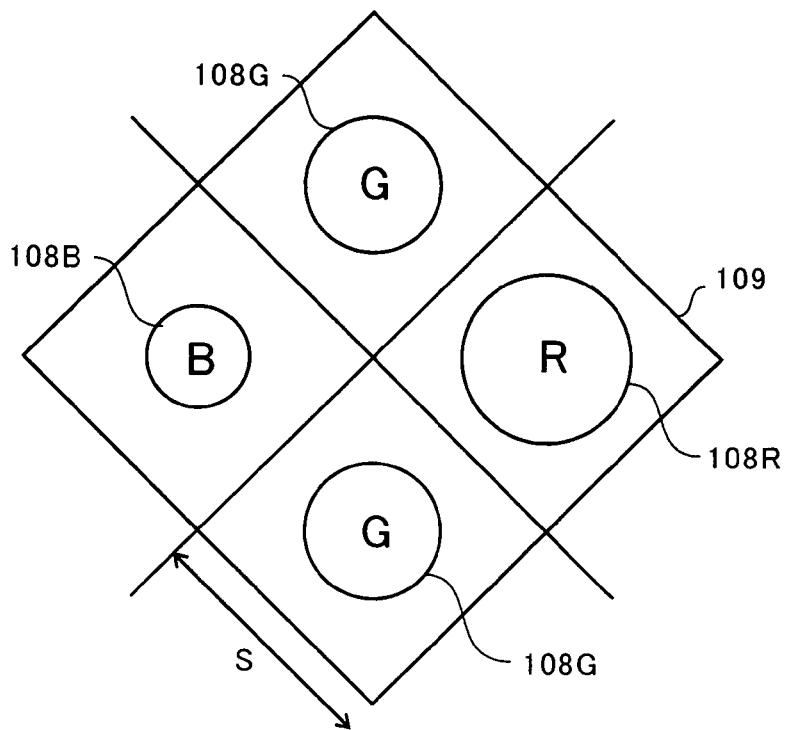

FIGS. 11A and 11B are plan views showing shapes of the openings and the opening areas of the openings 108 according to the second embodiment of the present invention.

In FIG. 11A, a case that a shape of the opening is set to be a square is shown. As shown in the drawing, each of the openings 108 is formed to be a square or substantially be a square, and the opening areas (108RL, 108GL, 108BL) of the openings 108R, 108G and 108B are set to have a relationship represented by an equation: 108RL>108GL>108BL. The term "substantially" in this specification is used to include an acceptable error range caused by a manufacturing process, etc.

By making the shape of the openings a square (an isotropic shape), as explained with reference to FIG. 8, as compared with the case of the rectangular shaped openings, when a pixel size becomes much smaller, decline of light concentrating efficiency can be controlled (reduced).

In FIG. 11B, a case that a shape of the openings is set to be a circle is shown. As shown in the drawing, the openings 108 are formed to be a circle or substantially to be a circle, and opening areas (108RL, 108GL and 108BL) of the openings 108R, 108G and 108B are set to have a relationship represented by an equation: 108RL>108GL>108BL. By making the shape of the openings a circle or substantially a circle (an isotropic shape), as in the case of square shown in FIG. 11A, as compared with the case of the rectangular shaped openings, when pixel size becomes much smaller, decline of light concentrating efficiency can be controlled (reduced). Moreover, the shape of the openings may be an oval.

Figure 12:
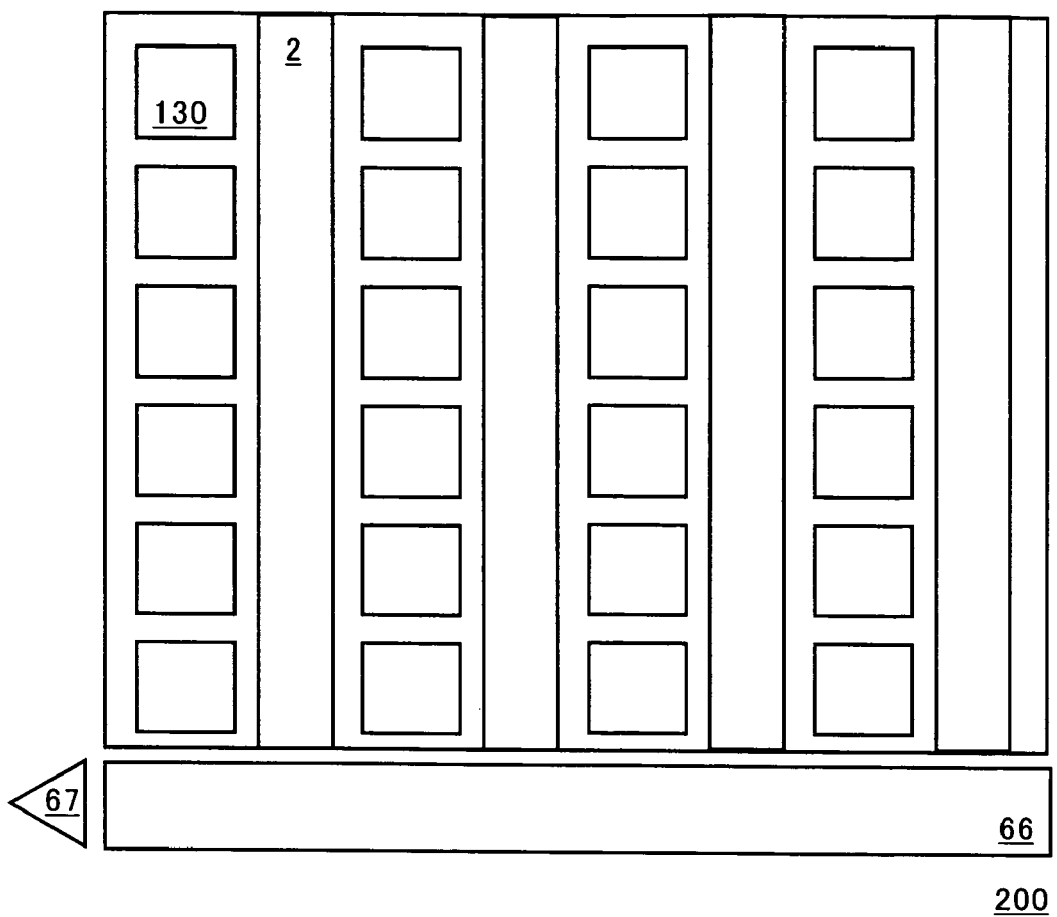
FIG. 12 is a plan view showing a solid-state imaging device according to a modified example of the second embodiment of the present invention.
Figure 13A:
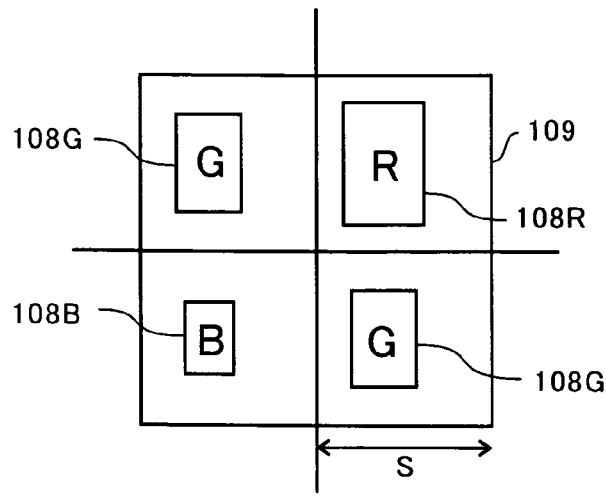
FIGS. 13A to 13C are plan views showing various shapes of the opening and the opening area of the opening according to modified examples of the second embodiment of the present invention.
Figure 13B:
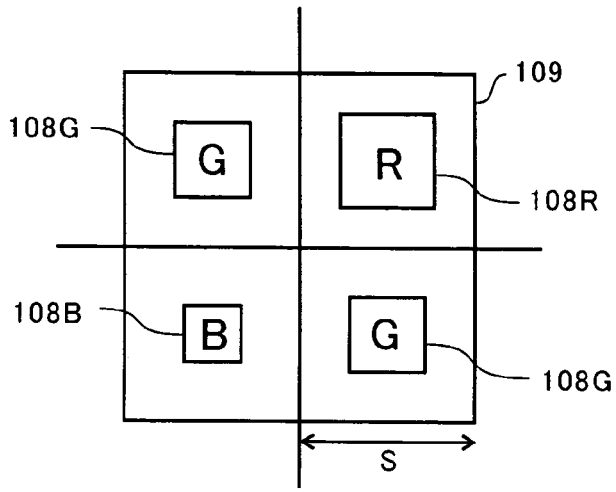
Figure 13C:
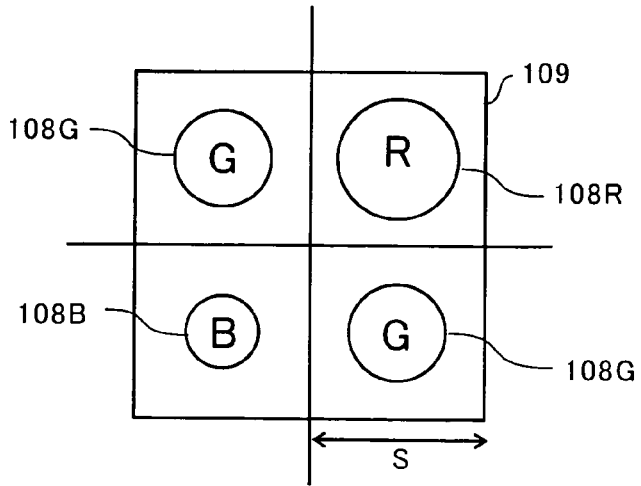

FIG. 12 is a plan view showing a solid-state imaging device 200 according to a modified example of the second embodiment of the present invention. In this modified example, comparing to the second embodiment, it is different that the photoelectric conversion elements 130 are arranged in a tetragonal matrix. In this case, the openings 108 of the light shielding film are arranged as shown in FIG. 13A to FIG. 13C. In the case of this modified example, as same as those shown in FIG. 11A to FIG. 11B, the opening area (108RL, 108GL and 108BL) of the openings 108R, 108G and 108B are set to have a relationship represented by an equation: 108RL>108GL>108BL. Moreover, in FIG. 13A, a case that the shape of the openings is a rectangle is shown. As shown in the drawing, the openings 108 are formed so that ratio of the long side and the short side is 1:4 or substantially 1:4, and the opening areas (108RL, 108GL and 108BL) of the openings 108R, 108G and 108B are set to have a relationship represented by an equation: 108RL>108GL>108BL. FIG. 13B and FIG. 13C are the cases in which each opening is a square and a circle, and as in the case shown in FIG. 13A, the opening areas (108RL, 108GL and 108BL) of the openings 108R, 108G and 108B are set to have a relationship represented by an equation: 108RL>108GL>108BL.

Figure 14A:
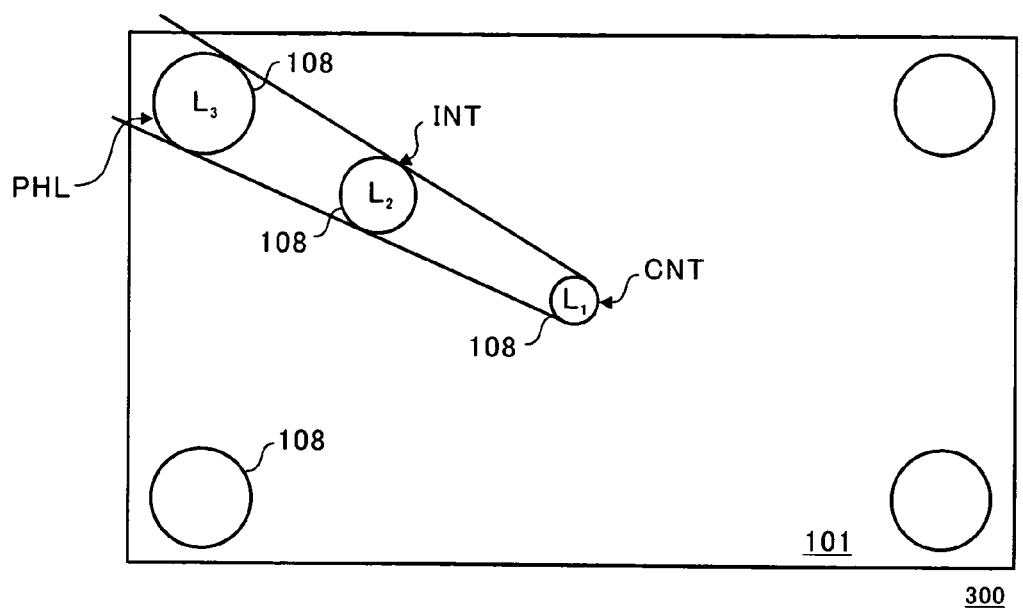
FIGS. 14A to 14B are plan views showing shapes of openings of a light shielding film in a light receiving region of a solid-state imaging device according to a third embodiment of the present invention.

FIG. 14A is a plan view showing shapes of openings of the light shielding film in the light receiving region 101 of a solid-state imaging device 300 according to the third embodiment of the present invention.

In the third embodiment, opening areas of the openings 108 are varied from the center part CNT to the peripheral part PHL. For example, when the opening area at the center part CNT is $L_1$ and the opening area at the peripheral part PHL is $L_3$, the opening areas are enlarged from the center part CNT to the peripheral part PHL in order to make L3=(vL1)/Sin θ. Moreover, when the opening area of the interval part INT between the center part CNT and the peripheral part PHL in the light receiving region is $L_2$, the openings 108 are formed in order to have a relationship represented by an equation: $L_1<L_2<L_3$ (or $L_1<L_2=L_3$ or $L_1=L_2<L_3$).

Figure 14B:
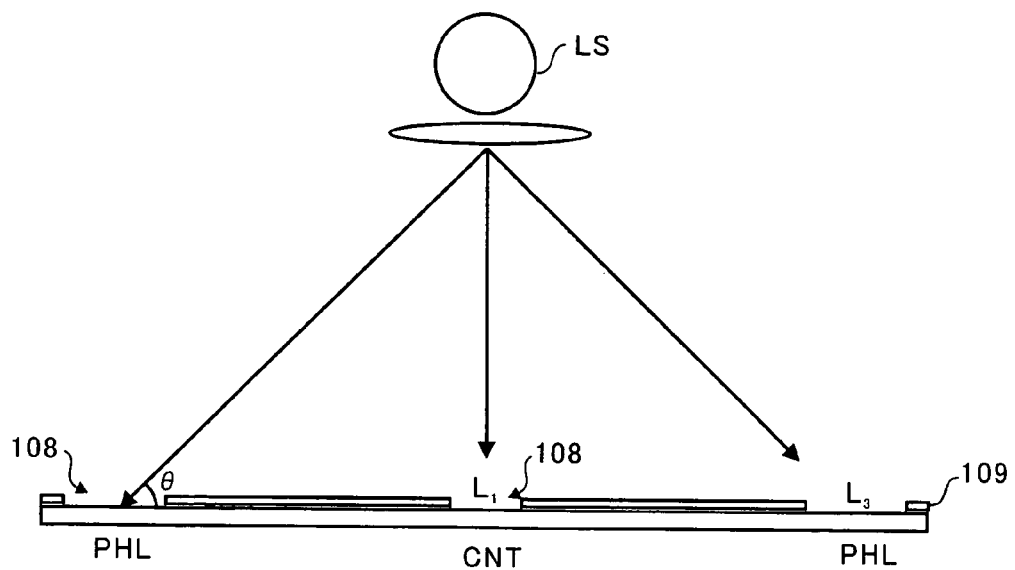

By doing that, as shown in FIG. 14B, the effective opening size for the same light source LS can be maintained to be the same both in the center part CNT and the peripheral part PHL. Therefore, decline of light concentrating efficiency at the peripheral part PHL of the light receiving region can be controlled (reduced). Moreover, the structure in the third embodiment is the same as the structure according to the second embodiment other than the point of change in the opening area of the light receiving film, and explanation for other structure is omitted.

Figure 15A:
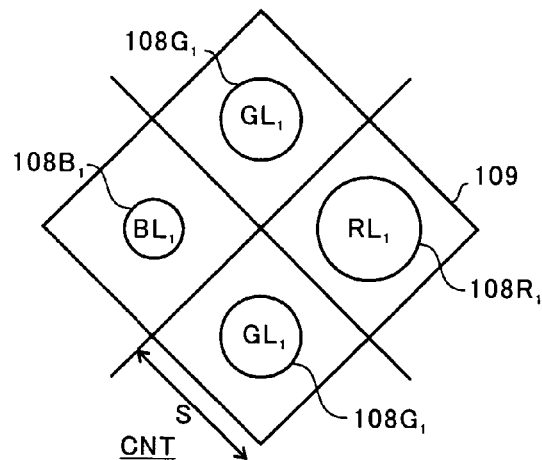
FIGS. 15A to 15C are plan views showing changes in an opening area of the openings according to the third embodiment of the present invention.
Figure 15B:
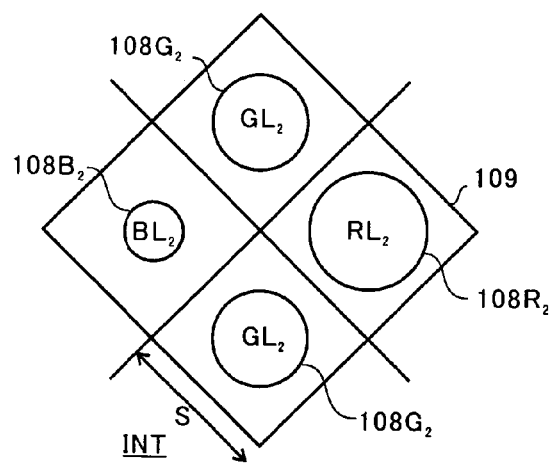
Figure 15C:
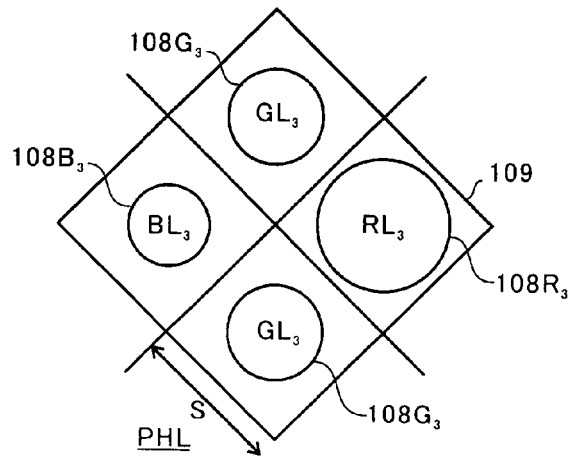

FIGS. 15A to 15C are plan views showing changes in the opening area of the openings 108 according to the third embodiment of the present invention.

FIG. 15A is a plan view showing a relationship among the openings $108R_1$, $108G_1$ and $108B_1$ at the center part of the light receiving region in FIG. 14A and the opening area parts $108RL_1$, $108GL_1$, and $108BL_1$. As shown in the figure, the opening area parts $108RL_1$, $108GL_1$, and $108BL_1$ of the openings $108R_1$, $108G_1$ and $108B_1$ are set to have a relationship represented by an equation: $108RL_1>108GL_1>108BL_1$.

FIG. 15B is a plan view showing a relationship among the openings $108R_2$, $108G_2$ and $108B_2$ at middle part INT between the center part CNT and the peripheral part PHL of the light receiving region and the opening area parts $108RL_2$, $108GL_2$, and $108BL_2$. As shown in the figure, the opening area parts $108RL_2$, $108GL_2$ and $108BL_2$ of the openings $108R_2$, $108G_2$ and $108B_3$ are set to have a relationship represented by an equation: $108RL_2>108GL_2>108BL_2$.

FIG. 15C is a plan view showing a relationship among the openings $108R_3$, $108G_3$ and $108B_3$ at the circumference part of the light receiving region in FIG. 14A and the opening area parts $108RL_3$, $108GL_3$, and $108BL_3$. As shown in the figure, the opening area parts $108RL_3$, $108GL_3$, and $108BL_3$ of the openings $108R_3$, $108G_3$ and $108B_3$ are set to have a relationship represented by an equation: $108RL_3>108GL_3>108BL_3$.

Here, a relationship among the opening areas from the center part CNT to the peripheral part PHL for the opening areas $108RL_1$ to $108RL_3$ of the openings $108R_1$ to $108R_3$ corresponding to the red color filter is set to have a relationship represented by an equation: $108RL_1<108RL_2<108RL_3$. The opening areas of the openings from $108G_1$ to $108G_3$ corresponding to the green color filter are set to have a relationship represented by an equation: $108GL_1<108GL_2=108GL_3$. The opening areas of the openings from $108B_1$ to $108B_3$ corresponding to the blue color filter are set to have a relationship represented by an equation: $108BL_1=108BL_2<108BL_3$. In the openings 108G and 108B corresponding to the green and the blue color filter, when the opening area is enlarged too much, as described above, the incident light enters in the direction of the read-out gate 170 or of the adjacent photoelectric conversion element 130, and causes smear. Therefore, increasing rate of the opening area makes lower than the opening 108R corresponding to the red color filter.

Moreover, as in the second embodiment, in the third embodiment, the square shaped opening as shown in FIG. 11A can be applied. In that case, the opening area of the openings 108 corresponding to each color filter is changed from the center part CNT to the peripheral part PHL of the light receiving region as shown in FIG. 15A to FIG. 15C.

Also, as in the second embodiment, it can be applied for a solid-state imaging device having a light receiving region arranging the photoelectric conversion elements in a tetragonal matrix. In this case, arrangement of the openings 108 shown in FIG. 15A to FIG. 15C is inclined at 45 degree. Also, when a light receiving region arranged the photoelectric conversion elements 130 in a tetragonal matrix is applied, the rectangular shape as shown in FIG. 13A of the opening can be applied.

Moreover, the openings 108 of the light shielding film according to the third embodiment can be applied to the solid-state imaging device according to the first embodiment.

Figure 16:
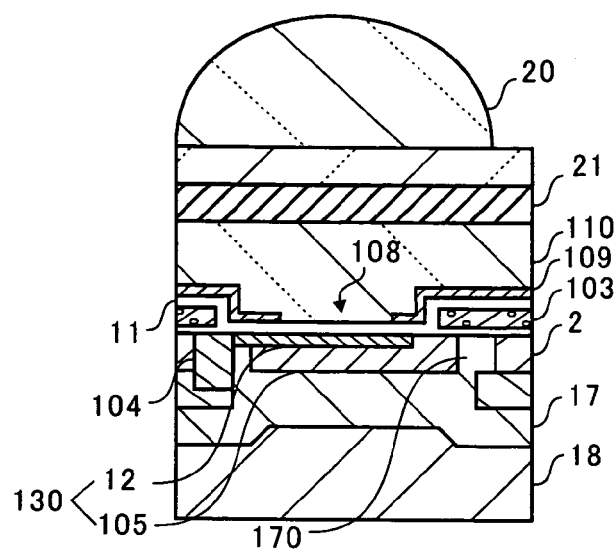
FIG. 16 is a cross sectional view showing a part of a solid-state imaging device according to a fourth embodiment of the present invention.

FIG. 16 is a cross sectional view showing a part of a solid-state imaging device 103 according to a fourth embodiment of the present invention. A difference from the before-described first to third embodiments is that a high refractive index insulating layer 110 with a higher refractive efficiency than the silicon oxide is formed instead of the planarizing layer 19 (or below the planarizing layer 19). The high refractive index insulating layer 110 is formed at least to fill up the openings 108 of the light shielding film 109.

The high refractive index insulating layer 110 has higher refractive efficiency than the silicon oxide used as a light permeable material and has a function to enlarge an effective size of the openings to demarcate the light shielding film. The high refractive index insulating layer 110 has the highest refractive efficiency of the materials to compose a light path. Further, the high refractive index insulating layer 110 may be formed with reference to an embodiment in a specification of Japanese Patent Application No. 2001-400665 filed by the same applicant as this invention. The entire contents of Japanese Patent Application No. 2001-400665, filed on Dec. 28, 2001, are herein incorporated by reference.

Figure 17:
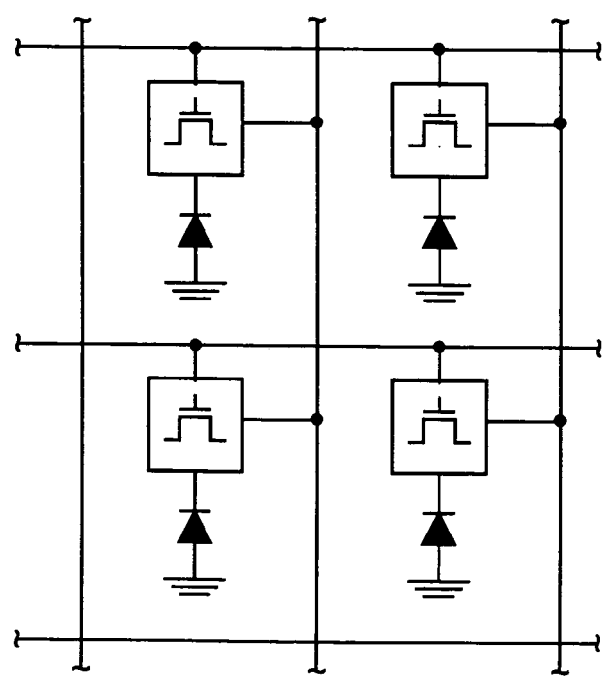
FIG. 17 is a schematic diagram showing an example of a MOS-type solid-state imaging device.

Moreover, as in the first embodiment, the second embodiment to the fourth embodiment can be used for the MOS-type solid-state imaging device as shown in FIG. 17 in addition to the CCD-type solid-state imaging device. Moreover, other structure of the MOS-type solid-state imaging device is based on the well-know techniques.

Further, a conductive type of each region in the embodiments may be reversed.

The present invention has been described in connection with the preferred embodiments. The invention is not limited only to the above embodiments. It is apparent that various modifications, improvements, combinations, and the like can be made by those skilled in the art.

For example, although a color filter has been used as an example for color decomposing means, the present invention is not limited to that. Preferable types of color decomposing means can arbitrary be selected to be used in accordance with an object or an architecture of the device.

The above described solid-state imaging device and its manufacturing method can be used for whole field of the digital cameras and those manufacturing method.

The invention claimed is:

1. A solid state imaging device, comprising:
   a color decomposer that decomposes incident light into a plurality of colors including at least a color of a first wavelength and a color of a second wavelength that is shorter than the first wavelength;
   a light shielding film that is formed under the color decomposer and comprises first openings through which light decomposed to the color of the first wavelength is transmitted and second openings through which light decomposed to the color of the second wavelength is transmitted, the second openings being formed to be smaller than the first openings, wherein sizes of the first and second openings are determined based on the wavelengths of the first and second colors transmitted therethrough; and
   a plurality of photo electric conversion regions that are arranged in lines and columns, each of the photo electric conversion regions generating signal electric charges corresponding to an amount of the incident light by receiving the incident light decomposed by the color decomposer and passed through the openings of the light shielding film, each of the photo electric conversion regions includes a high-sensitivity photodiode, a low-sensitivity photodiode, and a photodiode isolation region provided between the high-sensitivity photodiode and the low-sensitivity photodiode, wherein the second opening over the low-sensitivity photodiode is smaller than the first opening over the low-sensitivity photodiode, and wherein a conjunction depth of the low-sensitive photodiode is shallower than that of the high-sensitive photodiode.

2. The solid state imaging device according to claim 1, wherein
   the color decomposer decomposes the incident light further into a color of a third wavelength that is shorter than the second wavelength,
   the light shielding film further comprises third openings thorough which light decomposed to the color of the third wavelength is transmitted, and
   the second openings are formed to be larger than the third openings.

3. The solid state imaging device according to claim 2, wherein the color of the first wavelength is red, the color of the second wavelength is green, and the color of the third wavelength is blue.

4. The solid state imaging device according to claim 1, wherein the openings are shaped in an isotropic shape.

5. The solid state imaging device according to claim 1, wherein the openings are shaped in a square shape.

6. The solid state imaging device according to claim 1, wherein the openings are shaped in a circle shape.

7. The solid state imaging device according to claim 1, wherein sizes of the openings in a peripheral area of a light receiving region are relatively larger than sizes of the openings in a center area of a light receiving region.

8. The solid state imaging device according to claim 1, wherein the openings are filled with material with high refraction index.

9. The solid state imaging device according to claim 1, wherein the plurality of the photo electric conversion elements are arranged in Pixel Interleaved Arrangement.

10. The solid state imaging device according to claim 1, wherein the plurality of the photo electric conversion elements are arranged in a tetragonal matrix.

11. The solid state imaging device according to claim 1, further comprising a vertical electric charge transfer channel for each column of the photo electric conversion elements.

12. The solid state imaging device according to claim 1, further comprising a MOS type electric charge detecting circuit for each column of the photo electric conversion elements.

13. A digital camera, comprising the solid state imaging device according to claim 1.

14. A solid state imaging device, comprising:
a color decomposer that decomposes incident light into a color of a first wavelength, a color of a second wavelength that is shorter than the first wavelength, and a color of a third wavelength that is shorter than the second wavelength;
a light shielding film that is formed under the color decomposer and comprises first openings through which light decomposed to the color of the first wavelength is transmitted, second openings through which light decomposed to the color of the second wavelength is transmitted, and third openings through which light decomposed to the color of the third wavelength is transmitted; and
a plurality of photo electric conversion regions that are arranged in lines and columns, each of the photo electric conversion regions generating signal electric charges corresponding to an amount of the incident light by receiving the incident light decomposed by the color decomposer and passed through the openings of the light shielding film and comprising a first photo electric conversion element with a first sensitivity, a second photo electric conversion element with a second sensitivity that is lower than the first sensitivity, and an isolation region provided between the first and second photo electric conversion element, wherein
a size of a region of each first opening over the second photoelectric conversion element is larger than a size of a region of each second opening over the second photoelectric conversion element or a size of a region of each third opening over the second photoelectric conversion element is smaller than the size of the region of each second opening over the second photoelectric conversion element, wherein the sizes of the region of the first, second, and third openings are determined based on the wavelengths of the first, second, and third colors transmitted therethrough.

15. The solid state imaging device according to claim 14, wherein the color of the first wavelength is red, the color of the second wavelength is green, and the color of the third wavelength is blue.

16. The solid state imaging device according to claim 15 wherein the second photoelectric conversion element is 100% to 140% of the size of the region of each second opening over the second photoelectric conversion element, or
the size of the region of each third opening over the second photoelectric conversion element is 60% to 100% of the size of the region of each second opening over the second photoelectric conversion element.

17. The solid state imaging device according to claim 14, wherein sizes of the openings in a peripheral area of a light receiving region are relatively larger than sizes of the openings in a center area of a light receiving region.

18. The solid state imaging device according to claim 14, wherein the openings are filled with material with high refraction index.

19. The solid state imaging device according to claim 14, wherein the plurality of the photo electric conversion elements are arranged in Pixel Interleaved Arrangement.

20. The solid state imaging device according to claim 14, wherein the plurality of the photo electric conversion elements are arranged in a tetragonal matrix.

21. The solid state imaging device according to claim 14, further comprising a vertical electric charge transfer channel for each column of the photo electric conversion elements.

22. The solid state imaging device according to claim 14, further comprising a MOS type electric charge detecting circuit for each column of the photo electric conversion elements.

23. A digital camera, comprising the solid state imaging device according to claim 14.

24. A solid state imaging device, comprising:
a color decomposer that decomposes incident light into a plurality of colors including at least a color of a first wavelength and a color of a second wavelength that is shorter than the first wavelength;
a light shielding film that is formed under the color decomposer and comprises first openings through which light decomposed to the color of the first wavelength is transmitted and second openings through which light decomposed to the color of the second wavelength is transmitted, the second openings being formed to be smaller than the first openings, wherein sizes of the first and second openings are determined based on the wavelengths of the first and second colors transmitted therethrough; and
a plurality of photo electric conversion regions that are arranged in lines and columns, each of the photo electric conversion regions generating signal electric charges corresponding to an amount of the incident light by receiving the incident light decomposed by the color decomposer and passed through the openings of the light shielding film, each of the photo electric conversion regions includes a high-sensitivity photodiode, a low-sensitivity photodiode, and a photodiode isolation region provided between the high-sensitivity photodiode and the low-sensitivity photodiode,
wherein the second opening over the low-sensitivity photodiode is smaller than the first opening over the low-sensitivity photodiode, and
wherein the low-sensitivity photodiode and the high-sensitivity photodiode are impurity layers formed in a semiconductor substrate and separate from a surface of the substrate.

25. The solid state imaging device according to claim 24, wherein the impurity layers forming the low-sensitivity photodiode and the high-sensitivity photodiode are separate from the surface of the substrate via a buried isolation layer.

26. The solid state imaging device according to claim 24, wherein the high-sensitivity photodiode, the low-sensitivity photodiode, and the photodiode isolation region are separate from the surface of the substrate by a same depth.

* * * * *